(12) United States Patent
Gorbachov et al.

(10) Patent No.: US 9,853,620 B2
(45) Date of Patent: Dec. 26, 2017

(54) COUPLED-RESONATOR ON-DIE FILTERS FOR WIFI APPLICATIONS

(71) Applicant: SKYWORKS SOLUTIONS, INC., Woburn, MA (US)

(72) Inventors: Oleksandr Gorbachov, Irvine, CA (US); Lisette L. Zhang, Irvine, CA (US); Huan Zhao, Irvine, CA (US); Lothar Musiol, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 222 days.

(21) Appl. No.: 14/268,199

(22) Filed: May 2, 2014

(65) Prior Publication Data
US 2014/0327497 A1 Nov. 6, 2014

Related U.S. Application Data

(60) Provisional application No. 61/819,469, filed on May 3, 2013.

(51) Int. Cl.
*H03H 7/09* (2006.01)
*H03H 7/01* (2006.01)

(52) U.S. Cl.
CPC ............ *H03H 7/09* (2013.01); *H03H 7/0115* (2013.01); *H03H 7/1708* (2013.01); *H03H 7/1758* (2013.01); *H03H 7/1791* (2013.01)

(58) Field of Classification Search
CPC ......... H03H 7/0115; H03H 2001/0085; H03H 7/09; H03H 7/1758; H03H 7/1708; H03H 7/1791

(Continued)

(56) References Cited

U.S. PATENT DOCUMENTS 6,031,435 A 2/2000 Inose et al.
6,775,901 B1 8/2004 Lee et al.
(Continued)

FOREIGN PATENT DOCUMENTS

DE 1035201 7/1958
DE 102007049121 4/2008
EP 1 056 201 A2 11/2000

OTHER PUBLICATIONS

International Search Report and Written Opinion for corresponding Patent Cooperation Treaty Application. PCT/US14/36585; Sep. 8, 2014; 12 Pages.

(Continued)

*Primary Examiner* — Rakesh Patel
(74) *Attorney, Agent, or Firm* — Stetina Brunda Garred & Brucker

(57) ABSTRACT

A radio frequency (RF) filter circuit for rejecting one or more spurious components of an input signal has a first resonator circuit including a first capacitor and a first coupled inductor pair of a first inductor and a second inductor, and a second resonator circuit with a second capacitor and a second coupled inductor pair of a third inductor and a fourth inductor. First and second resonator coupling capacitors are connected to the first resonator circuit and the second resonator circuit. A first port and a second port are connected to the first resonator circuit and the second resonator, with the filtered signal of the input signal passed through both the first resonator circuit and the second resonator circuit being output.

52 Claims, 20 Drawing Sheets

(58) Field of Classification Search
USPC ......... 333/168, 175, 176, 185, 174; 336/200
See application file for complete search history.

(56) References Cited

U.S. PATENT DOCUMENTS

| | | | | |
|---|---|---|---|---|
| 7,532,092 | B2 * | 5/2009 | Chen | .................. H01P 1/20381 |
| | | | | 333/185 |
| 7,869,784 | B2 | 1/2011 | Liu | |
| 2002/0171510 | A1 * | 11/2002 | Kushitani | ................ H03H 7/09 |
| | | | | 333/177 |
| 2005/0122198 | A1 * | 6/2005 | Zhou | .................. H01F 17/0033 |
| | | | | 336/200 |
| 2009/0168387 | A1 * | 7/2009 | Leipold | ................ H01L 23/645 |
| | | | | 361/811 |
| 2010/0244263 | A1 | 9/2010 | Lin et al. | |
| 2011/0010749 | A1 * | 1/2011 | Alkan | ..................... H03H 1/00 |
| | | | | 725/127 |
| 2011/0074526 | A1 | 3/2011 | Taniguchi | |
| 2012/0119852 | A1 * | 5/2012 | Sasaki | ................ H01P 1/20345 |
| | | | | 333/204 |

OTHER PUBLICATIONS

Supplemental European Search Report for corresponding European Patent Application No. EP14791926; Nov. 28, 2016.

* cited by examiner

COUPLED-RESONATOR ON-DIE FILTERS FOR WIFI APPLICATIONS

CROSS-REFERENCE TO RELATED APPLICATIONS

This application relates to and claims the benefit of U.S. Provisional Application No. 61/819,469, filed May 3, 2013 and entitled COUPLED RESONATOR ON DIE FILTERS FOR WIFI APPLICATIONS, the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) signal circuitry, and more particularly, to coupled resonator on-die filters for WiFi applications.

2. Related Art

Wireless communications systems are utilized in a variety contexts involving information transfer over long and short distances alike, and a wide range of modalities for addressing the particular needs of each being known in the art. As a general matter, wireless communications involve a radio frequency (RF) carrier signal that is variously modulated to represent information/data, and the encoding, modulation, transmission, reception, de-modulation, and decoding of the signal conform to a set of standards for coordination of the same.

In the local area data networking context, WLAN or Wireless LAN, also commonly referred to as WiFi as well as 802.11 (referring to the governing IEEE standard), is the most widely deployed. The WiFi standard specifies a time domain duplex system where a bi-directional link is emulated on a time-divided communications channel. Several computer systems or network nodes within a local area can connect to an access point, which in turn may provide a link to other networks and the greater global Internet network. Computing devices of all form factors, from mobile phones, tablets, and personal computers now have WiFi connectivity, and WiFi networks may be found everywhere.

As is fundamental to any wireless communications systems, a WiFi network interface device includes a transceiver, that is, a combined transmitter and receiver circuitry. The transceiver, with its digital baseband system, encodes the digital data to an analog baseband signal, and modulates the baseband signal with an RF carrier signal. Upon receipt, the transceiver down-converts the RF signal, demodulates the baseband signal, and decodes the digital data represented by the baseband signal. An antenna connected to the transceiver converts the electrical signal to electromagnetic waves, and vice versa. In most cases, the transceiver circuitry itself does not generate sufficient power or have sufficient sensitivity necessary for communications. Thus, additional circuits are referred to as a front end is utilized between the transceiver and the antenna. The front end includes a power amplifier for boosting transmission power, and/or a low noise amplifier to increase reception sensitivity.

Allocations and other usage restrictions of the RF spectrum are established on a region-by-region basis by governmental agencies having jurisdiction in those particular regions. In the United States, the Federal Communications Commission is the responsible agency. One widely used frequency allocation is the Industrial-Scientific-Medical (ISM) band, and WiFi systems utilize the 2.4 GHz frequency in the ISM band (referred to herein as the 2 GHz band). More recent iterations of the IEEE WLAN standard also specify the use of the 5 GHz operating frequency in the ISM band, for which usage has been licensed.

A typical multimode WLAN transceiver thus has a separate 5 GHz module and a 2 GHz module, with separate inputs, outputs, and enable lines for activating the transmit and receive amplification functions. One variation involves the use of two separate antennas for each operating frequency. That is, there may be 5 GHz antenna to which a power amplifier circuit and a low noise amplifier circuit specific to the 5 GHz transmission and reception are selectively connected over a single pole, double throw switch. There may also be a 2 GHz antenna to which a power amplifier circuit and a low noise amplifier circuit specific to the 2 GHz transmission and reception are selectively connected over another single pole, double throw switch. There may be various co-existence filters at the input of the respective power amplifier circuits as well as at the antennas. Another variation relies upon a single antenna for both receive and transmit functions in both operating frequencies. In such a configuration, there may be a duplexer connected to the single antenna that is connected to the respective transmit/receive switches for each operating frequency.

During concurrent operation, the 5 GHz transceiver and related circuitry, and the 2 GHz transceiver and related circuitry, can generate high levels of unwanted emissions for counterpart receivers. In the aforementioned WLAN system, whether dual antenna or single antenna, signals generated at the 5 GHz power amplifier can interfere with 2 GHz low noise amplifier. Conversely, the signals generated at the 2 GHz power amplifier can interfere with the 5 GHz low noise amplifier. Furthermore, there may be interference as between the two switches, the output ports of the front end circuit, and the antennas. WiFi connectivity is oftentimes not the only RF signal source in most multi-function devices, and there are other wireless communications modalities such as cellular telephone transceivers and GPS (Global Positioning System) receivers in close proximity. In such case, interference from and interference to these other modalities may also occur.

The 5 GHz WLAN transceivers tend to exhibit a high level of local oscillator spurs at the 3.2 GHz to 3.9 GHz range, as well as the 6.8 GHz to 7.8 GHz range. Similarly, the 2 GHz WLAN transceivers have a fairly high level of local oscillator spurs at the 1.6 GHz to 1.7 GHz range, as well as the 3.2 GHz to 3.5 GHz range. It is thus desirable for the front end circuit to reject these frequencies, partly in order to meet FCC spectrum emission requirements, and partly to minimize receiver desensitization in other communication modalities. Indeed, if the transmit chain has sufficient gain, these spurious emissions may be amplified and transmitted such that government-mandated co-existence parameters are exceeded and would limit or prevent the operation of other wireless systems. Furthermore, there are restricted bands in which transceiver circuitry cannot exhibit more than −41.5 dB/MHz of spurious emissions, and the aforementioned spurs of may be within such restricted bands. Even in unrestricted frequency bands, different locales may limit the level of allowed emissions.

Various filters implemented in the front end module for rejecting these spurious emissions in WLAN applications are known in the art. One example is a differential filter based on bond wires, though parasitic coupling between inductors in the circuit are avoided. However, such filters typically have high insertion loss on the order of 10 dB or greater, and the matching characteristics are problematic. One known implementation has an input return loss ($S_{11}$) of −3 dB in-band. Accordingly, there is a need in the art for filters with improved rejection characteristics for unwanted emissions generated from dual band WiFi systems in close proximity to the pass band, with minimal loss, and better matching characteristics.

BRIEF SUMMARY

The present disclosure is directed to filtering of unwanted emissions in dual band WLAN systems based on two coupled resonators. The filter is understood to have low insertion loss with improved matching characteristics. Different combinations of the resonator circuits may achieve high levels of rejection at particular frequencies of interest where local oscillator spurs and other unwanted signals are known to occur in 2 GHz and 5 GHz WLAN systems.

According to one embodiment, there is an RF filter circuit for rejecting one or more spurious components of an input signal is disclosed. The filter circuit may include a first resonator circuit that has a first capacitor and a first coupled inductor pair of a first inductor and a second inductor. The filter circuit may also include a second resonator circuit with a second capacitor and a second coupled inductor pair of a third inductor and a fourth inductor. There may be first and second resonator coupling capacitors, each of which may be connected to the first resonator circuit and the second resonator circuit. Furthermore, there may be a first port that is connected to at least one of the first resonator circuit and the second resonator circuit, as well as a second port connected to at least one of the first resonator circuit and the second resonator circuit. The input signal may be connected to one of the first port and the second port. A filtered signal of the input signal passed through both the first resonator circuit and the second resonator circuit may be output from a other one of the first port and the second port.

Another embodiment of the present disclosure is also directed to an RF filter circuit that is used to reject one or more spurious components of an input signal. There may be a first filter stage that is cascaded to a second filter stage. Each stage may be configured identically and include a first resonator circuit, a second resonator circuit, and first and second resonator coupling capacitors. The first resonator circuit may include a first capacitor and a first coupled inductor pair of a first inductor and a second inductor. The second resonator circuit may include a second resonator circuit of a second capacitor and a second coupled inductor pair of a third inductor and a fourth inductor. Additionally, in each stage there may be first and second resonator coupling capacitors each connected to the first resonator circuit and the second resonator circuit. The filter may also include a first port connected to the first filter stage, and a second port that is connected to the second filter stage. The input signal is connected to one of the first port and the second port. A filtered signal of the input signal passed through the first resonator circuits and the second resonator circuits of both the first filter stage and the second filter stage may be output from a other one of the first port and the second port.

Still another embodiment of the present disclosure is an RF filter circuit for rejecting one or more spurious components of an input signal. The filter circuit may include a first resonator circuit with a first capacitor and a first coupled inductor pair of a first inductor and a second inductor. The filter circuit may also include a second resonator circuit with a second capacitor and a second coupled inductor pair of a third inductor and a fourth inductor. There may be a resonator coupling capacitor connected to the first resonator circuit and the second resonator circuit. The filter circuit may include a first port connected to at least one of the first resonator circuit and the second resonator circuit. There may also be a second port that is connected to at least one of the first resonator circuit and the second resonator circuit. The input signal may be transmitted to one of the first port and the second port. A filtered signal of the input signal passed through both the first resonator circuit and the second resonator circuit may be output from a other one of the first port and the second port.

The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The present disclosure encompasses various embodiments of coupled resonator filter for rejecting spurious emissions generated by, for example, dual band WLAN systems. The filter is capable of rejecting unwanted emissions at various key frequencies for co-existence with other RF systems. The filter is based on two resonator circuits coupled with each other in different combinations, and can be implemented as on-die circuits to reduce size and cost. Multiple combinations of the filters can be utilized to achieve additional rejection of unwanted emissions. The detailed description set forth below in connection with the appended drawings is intended as a description of the several presently contemplated embodiments of the filter, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
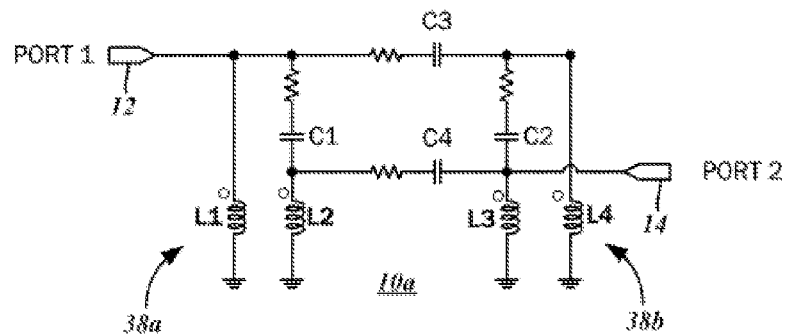
FIG. 1 is a schematic diagram of an exemplary coupled resonator filter in accordance with one embodiment of the present disclosure including a first resonator circuit and a second resonator circuit.

With reference to the schematic diagram of FIG. 1, a first embodiment of a coupled resonator filter 10a generally has a first port 12 and a second port 14. The first port 12 is understood to be an input port, and accordingly receives an input signal. Various embodiments of the present disclosure contemplate the rejection of spurious emissions from a dual band, 2.4 GHz/5 GHz WLAN transceiver, also referred to as WiFi, and so the input signal is understood to be that which is generated thereby. The coupled resonator filter 10 rejects these spurious emissions from the input signal, and passes the same to the second port 14, which is understood to be an output port. It is possible for the first port 12 to serve as the output port and for the second port 14 to serve as the input port, however.

Figure 2:
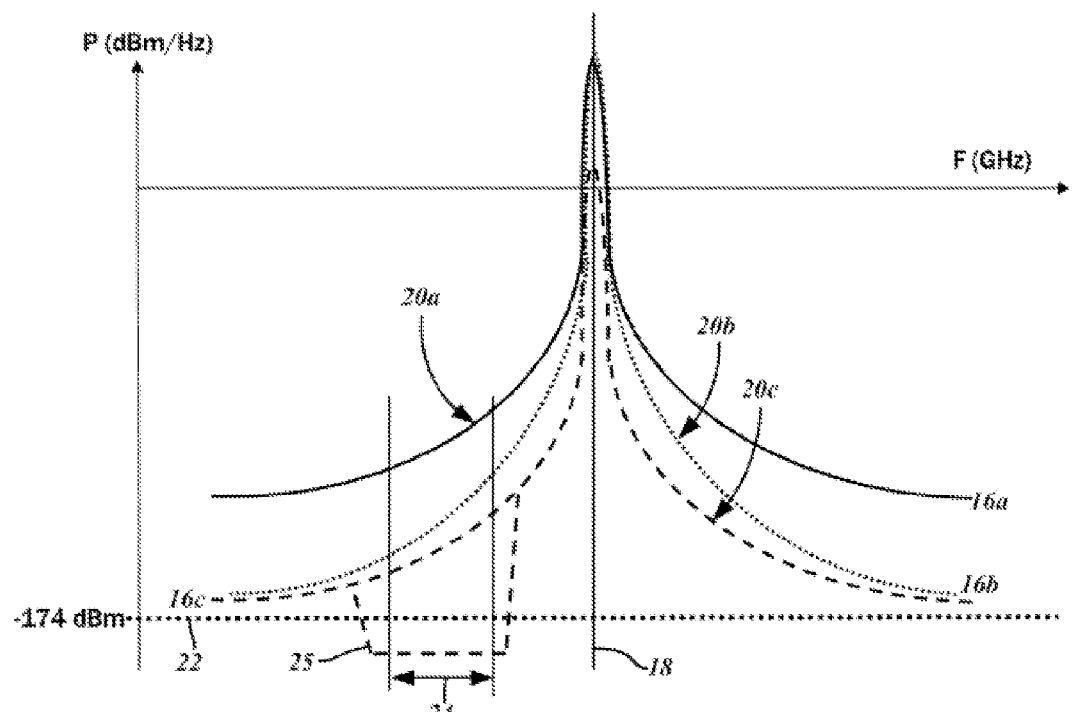
FIG. 2 is a graph illustrating noise contributions at a GPS receiver from a WLAN transmitter.

The graph of FIG. 2 illustrates one possible interference from WLAN transmit signals as affecting a GPS (Global Positioning System) receiver. A first plot 16a is of the WLAN transmit signal at the WLAN antenna, a second plot 16b is of the WLAN transmit signal as generated by the front end/power amplifier, and a third plot 16c is of the WLAN transmit signal as generated by the transceiver, before amplification by the front end/power amplifier. A center frequency 18 corresponds to the WLAN operating frequency of 2.45 GHz, with the operating frequency band extending between 2.4 GHz and 2.495 GHz. The first plot 16a shows a noise shoulder 20a at the antenna, to which phase noise, power amplifier noise figure, and modulation are contributors. The second plot 16b likewise shows a noise shoulder 20b at the power amplifier output, and the third plot 16c shows a noise shoulder 20c at the front end input. At the antenna, there is a thermal noise floor 22 of −174 dBm/Hz, but the noise shoulders 20 are sufficiently above this floor to interfere with other radio frequency modalities. The graph depicts a GPS receive band 24 in the center operating frequency of 1.575 GHz, within which there are substantial power components of the noise shoulders 20 of the WLAN input signal in an interference region 25. The power amplifier output noise as a result of transceiver noise is directly proportional to gain in this frequency range. It will be recognized that although the noise shoulders are shown as smooth lines, in actual operation, spikes or spurs appear at these shoulders.

Figure 3:
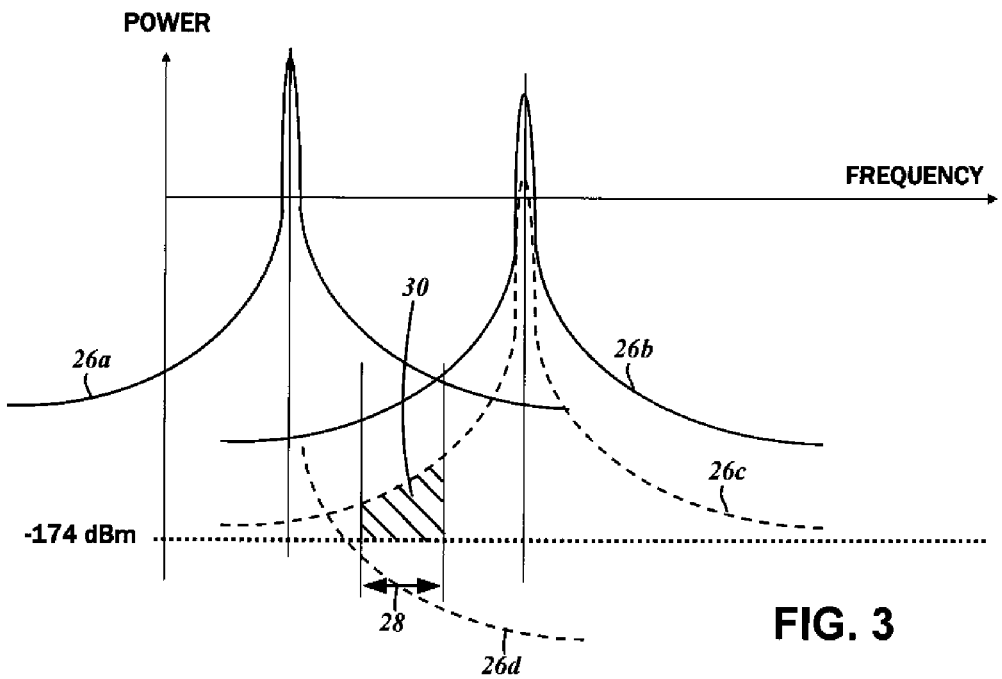
FIG. 3 is graph illustrating WCDMA and WLAN spectral components with overlapping regions of potential interference.

The graph of FIG. 3 illustrates the WLAN transmitter interference with WCDMA transmissions. A first plot 26a shows the WCDMA transmit signal frequency components at the WCDMA antenna. Furthermore, a second plot 26b shows the WLAN transmit signal at the WLAN antenna, and a third plot 26c shows the WLAN transmit signal at the input of the WCDMA receiver. There is understood to be a slight spatial separation between the WLAN antenna and the WCDMA antenna, so less than an entirety of the power from the WLAN antenna reaches the WCDMA antenna. A fourth plot 26d corresponding to the WCDMA transmit signal that appears on the WCDMA receiver is also shown. The receive band 28 of the WCDMA modality is illustrated, within which and above the thermal noise floor −174 dBm at the antenna there is an interference region 30 of relatively high power levels of the WLAN transmit signal.

Figure 4:
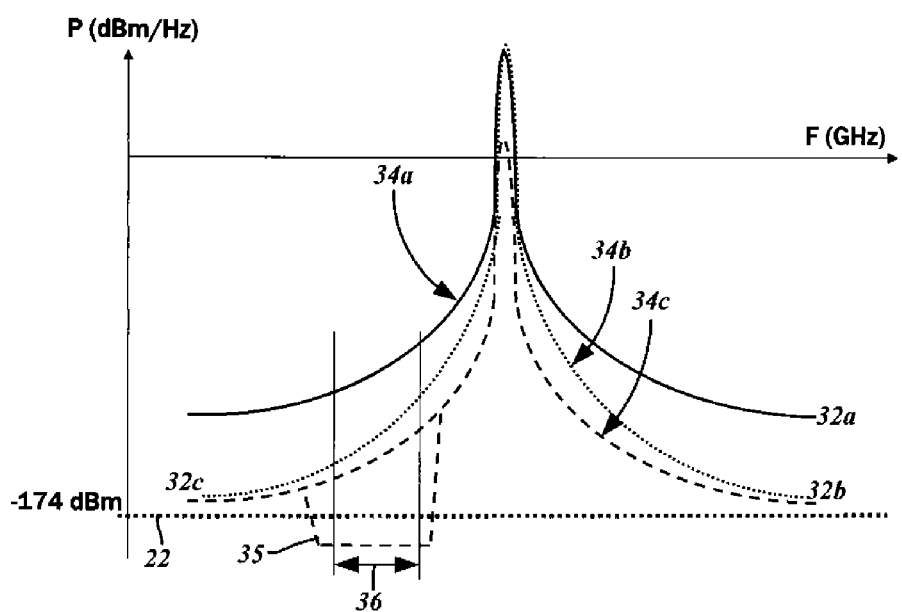
FIG. 4 is a graph illustrating noise contributions at a WCDMA receiver from a WLAN transmitter.

The graph of FIG. 4 illustrates another possible interference scenario resulting from WLAN transmit signals as affecting a WCDMA receiver. A first plot 32a is of the WLAN transmit signal at the WLAN antenna, a second plot 32b is of the WLAN transmit signal as generated by the front end/power amplifier, and a third plot 32c is of the WLAN transmit signal as generated by the transceiver, before amplification by the front end/power amplifier. As shown in the first plot 32a there is a noise shoulder 34a at the antenna, and the second plot 32b shows a noise shoulder 34b at the power amplifier output, and the third plot 32c shows a noise shoulder 34c at the front end input. Again, at the antenna, there is a thermal noise floor 22 of −174 dBm/Hz, but the noise shoulders 34 are sufficiently above this floor to interfere with other radio frequency modalities. The graph depicts a WCDMA receive band 36 in the operating frequency band of 2.11 GHz to 2.17 GHz, within which there are substantial power components of the noise shoulders 34 of the WLAN input signal in an interference region 35. The power amplifier output noise as a result of transceiver noise is directly proportional to gain in this frequency range. The present disclosure envisions rejection spurious emissions in the interference regions 25 (FIG. 2) in the GPS receive band and 35 (FIG. 4) in the WCDMA receive band.

The coupled resonator filter 10 in accordance with various embodiments of the present disclosure rejects these noise components and others of the WLAN input signal. The coupled resonator filter 10 may be connected to the input of the WLAN front end circuit for improved co-existence with other communications systems including the aforementioned WCDMA modality, GPS receiver, and so on. As will be described in further detail below, certain embodiments of the coupled resonator filter 10 are configured for the input signal being in the 2.4 GHz band, and is thus envisioned to improve co-existence with the 5 GHz WLAN system because second harmonic frequency rejection is improved. The filter can be placed at output of WLAN power amplifier as well.

Returning to the schematic diagram of FIG. 1, in the first embodiment of the coupled resonator filter 10a, the first port 12 is connected to a first node of a first inductor L1, as well as a first node of the capacitor C1, and a first node of a third capacitor C3. Furthermore, the second port 14 is connected to a first node of a third inductor L3, a second node of a second capacitor C2, and a second node of a fourth capacitor C4. A first node of the second inductor L2 is connected to a second node of the first capacitor C1, as well as to a first node of the fourth capacitor C4. A first node of a fourth inductor L4 is connected to a second node of the third capacitor C3 as well as a first node of the second capacitor C2. Second nodes of each of the first inductor L1, the second inductor L2, the third inductor L3, and the fourth inductor L4 are connected to ground. The impedance of the first port 12 and the second port 14 may be 50 Ohms in accordance with the first embodiment 10a, though any other impedance may be selected. The resistors shown connected to the capacitors C1-C4 are understood to be associated with resistive losses thereof, rather than separate resistor components. A typical resistive loss for these capacitors in one implementation of the coupled resonator filter 10 is understood to be 0.2 Ohms.

The first inductor L1, the second inductor L2, and the first capacitor C1 are understood to comprise a first resonator circuit 38a, while the third inductor L3, the fourth inductor L4, and the second capacitor C2 are understood to comprise a second resonator circuit 38b. The capacitors C1, C2 in the resonator circuits 38 may have a capacitance value of 4.3 pF. The first resonator circuit 38a is coupled to the second resonator circuit 38b by the third capacitor C3, also referred to as a first resonator coupling capacitor, and by the fourth capacitor C4, which may be referred to as a second resonator coupling capacitor. With the first port 12 being connected to the first resonator circuit 38a, and the second port 14 being connected to the second resonator circuit 38b, the input signal is coupled from the first resonator circuit 38a to the second resonator circuit 38b by the coupling capacitors C3, C4. In one implementation of the coupled resonator filter 10, the resonator coupling capacitors C3, C4 have a capacitance value of 3 pF.

The two inductors in the first resonator circuit 38a, e.g., the first inductor L1 and the second inductor L2, are understood to be magnetically coupled between coils thereof. In accordance with one embodiment, the coupling coefficient between these two inductors K1_2 is 0.35. The two inductors in the second resonator circuit 38b, e.g., the third inductor L3 and the fourth inductor L4, are likewise magnetically coupled between coils thereof. However, in this embodiment, there is understood to be no coupling between the inductors of the first resonator circuit 38a and the second resonator circuit 38b, e.g., the coupling coefficient between the first inductor L1 and the third inductor L3 or the fourth inductor L4 is zero, the coupling coefficient between the second inductor L2 and the third inductor L3 or the fourth inductor L4 is zero, and so forth. Similar to the first resonator circuit 38a, the coupling coefficient between these two inductors K3_4 is also 0.35. Each of the inductors L1, L2, L3, and L4 may have an inductance value of 0.5 nH with a resistive loss of 0.1 Ohm. Depending on which of the first port 12 or the second port 14 is the signal input, the first inductor L1 or the third inductor L3 may additionally serve an electrostatic discharge function when implemented on-die.

Although specific values of the components of the coupled resonator filter 10a are provided, these are understood to be by way of example only and not of limitation. The circuit may be tuned for other applications with different component values. Generally, however, it is understood that the circuit component values are selected in such a manner that input signal components in the cellular communications operating frequencies lower than 2.17 GHz, in addition to signal components in the GPS reception frequency in the 1.575 GHz range, there is a high level of rejection. In the illustrated embodiment, rejection of these frequency components of more than 20 dB is possible, as shown in the FIG. 5. Additionally, the circuit component values are selected to also reject input signal components in a different part of the spectrum of cellular communications operating frequencies in the 2.62 GHz to 2.69 GHz range at more than 5 dB. The rejection of second harmonic frequencies of the 2.4 GHz operating frequency, e.g., 4.8 GHz to 5 GHz, are understood to be higher than 10 dB. Beyond these spurious emission rejection characteristics, the components of the coupled resonator filter 10 configured for the 2.4 GHz WLAN operating frequency are selected so that insertion loss at such frequency is less than 2.5 dB.

Figure 5:
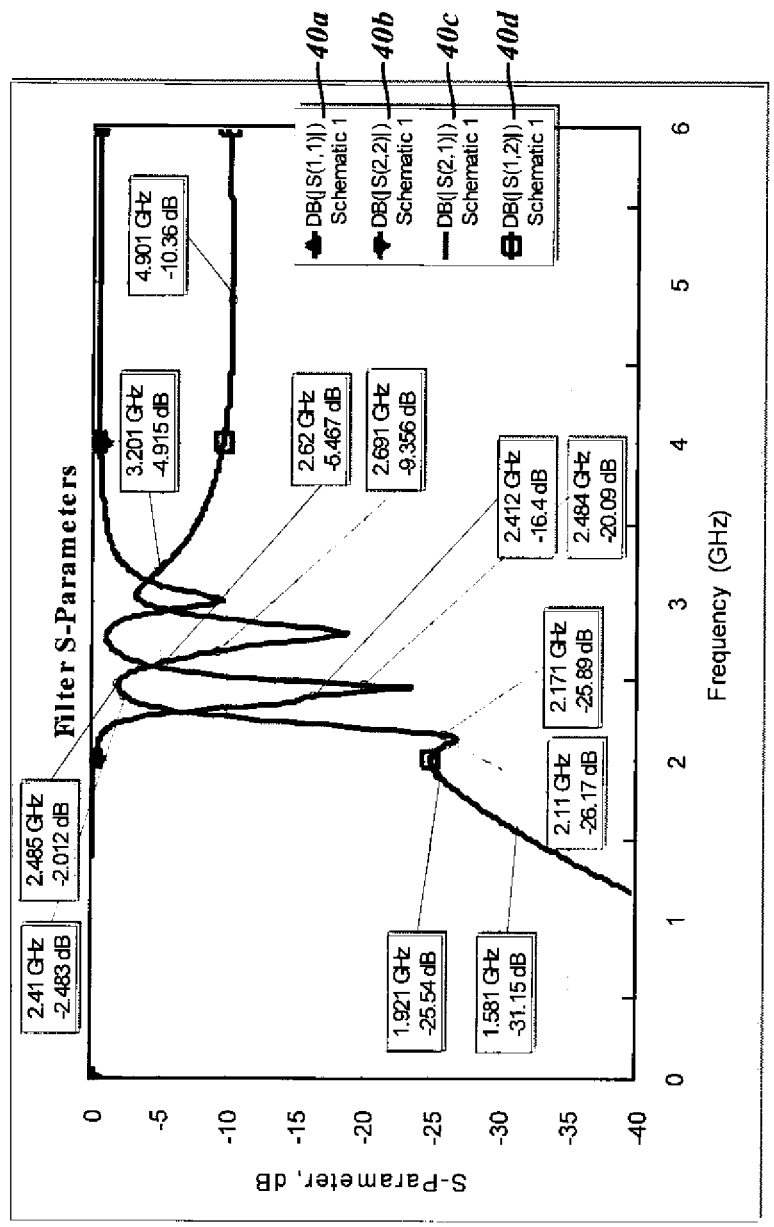
FIG. 5 is a graph plotting the S-parameters of the coupled resonator filter shown in FIG. 1.

The graph of FIG. 5 plots the various S-parameters of the first embodiment of the coupled resonator filter 10a. A first plot 40a shows the input return loss $S_{11}$, a second plot 40b shows the output return loss $S_{22}$, a third plot 40c shows the gain $S_{21}$ (forward gain) and a fourth plot 40d shows the isolation (reverse gain) $S_{12}$. Across various embodiments of the coupled resonator filter 10 configured for the 2.4 GHz WLAN operating frequency, the input return loss $S_{11}$ and the output return loss $S_{22}$ are both less than −15 dB. More broadly, the components of the coupled resonator filter 10 are selected to minimize input and output return loss at the WLAN operating frequencies.

The various embodiments of the coupled resonator filter 10 may be fabricated on a single integrated circuit semiconductor device with other active and passive circuit components of the front end module. When implemented thus, the coupled resonator filter 10 has a small footprint. Alternatively, the coupled resonator filter 10 may be configured in discrete form and utilizing printed circuit boards (PCB), low temperature co-fired ceramic (LTCC), and so on. The coupled inductors L1, L2, L3, and L4 may be implemented as conductive traces etched on to the semiconductor die, or as bond wires. Furthermore, the various capacitors C1, C2, C3, and C4 may be a metal-insulator-metal type, though any other suitable type may be readily substituted without departing from the present disclosure.

Figure 6:
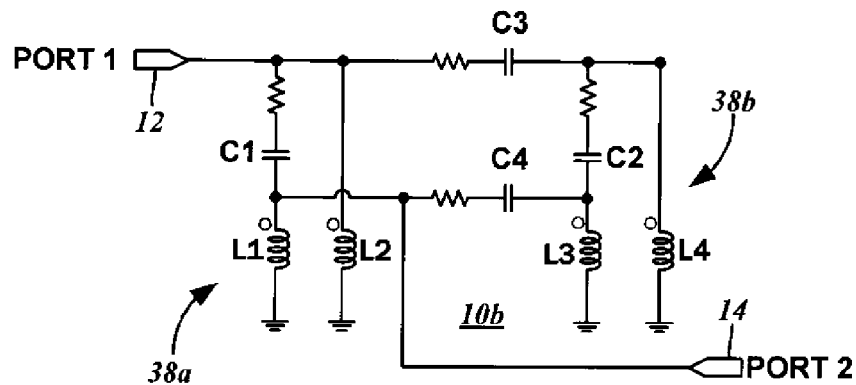
FIG. 6 is a schematic diagram of a second embodiment of the coupled resonator filter with both a first port and a second port connected to the first resonator circuit.

Referring now to the schematic of FIG. 6, a second embodiment of the coupled resonator filter 10b contemplates a nearly identical configuration as the first embodiment 10a, including the first resonator circuit 38a comprised of the capacitor C1 and the magnetically coupled inductors L1 and L2, and the second resonator circuit 38b comprised of the capacitor C2 and the magnetically coupled inductors L3 and L4. The first capacitor C1 and the second capacitor C2 may have capacitance values of 5.2 pF, with a resistive component of 0.2 Ohm. All of the inductors L1-L4 may have an inductance value of 0.5 nH, and a resistive component of 0.1 Ohm. The first pair of coupled inductors L1 and L2 may have a coupling coefficient of 0.1, as does the second pair of coupled inductors L3 and L4. The first resonator circuit 38a is coupled to the second resonator circuit 38b over the first resonator coupling capacitor C3 and the second resonator coupling capacitor C4, both of which may have a capacitance value of 3.5 pF and a resistive loss of 0.2 Ohm.

However, the second port 14 is connected to the first resonator circuit 38a, and in particular, at the junction between the second resonator coupling capacitor C4, the first inductor L1, and the first capacitor C1. This is envisioned to yield a different rejection characteristic at different frequencies. Again, although particular component values have been presented, they may be substituted to achieve different performance characteristics. In general, the circuit component values are selected in such a manner that input signal components in the cellular communications operating frequencies lower than 2.17 GHz (2.11 GHz to 2.17 GHz), in addition to signal components in the GPS reception frequency in the 1.575 GHz range, there is a high level of rejection of greater than 18 dB. The circuit component values are selected to reject input signal components in a different part of the spectrum of cellular communications operating frequencies in the 2.62 GHz to 2.69 GHz range at more than 5 dB. The rejection of second harmonic frequencies of the 2.4 GHz operating frequency, e.g., 4.8 GHz to 5 GHz, are understood to be higher than 15 dB. The local oscillator frequency of 3.2 GHz to 3.5 GHz may also be rejected at a level higher than 20 dB. Beyond these spurious emission rejection characteristics, the components of the coupled resonator filter 10 configured for the 2.4 GHz WLAN operating frequency are selected so that insertion loss at such frequency is less than 2.5 dB.

Figure 7:
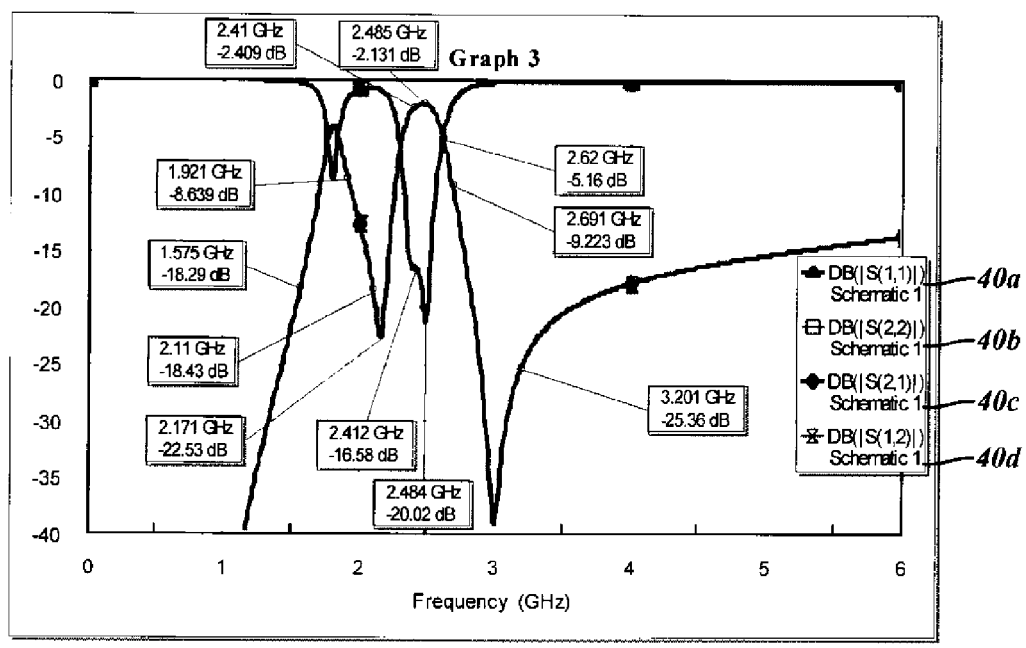
FIG. 7 is a graph plotting the S-parameters of the coupled resonator filter shown in FIG. 6.

The graph of FIG. 7 plots the various S-parameters of the second embodiment of the coupled resonator filter 10b. A first plot 40a shows the input return loss $S_{11}$, a second plot 40b shows the output return loss $S_{22}$, a third plot 40c shows the gain $S_{21}$ and a fourth plot 40d shows the isolation $S_{12}$. As shown, the input return loss $S_{11}$ and the output return loss $S_{12}$ are both less than −15 dB at the 2.4 GHz WLAN operating frequency.

Figure 8:
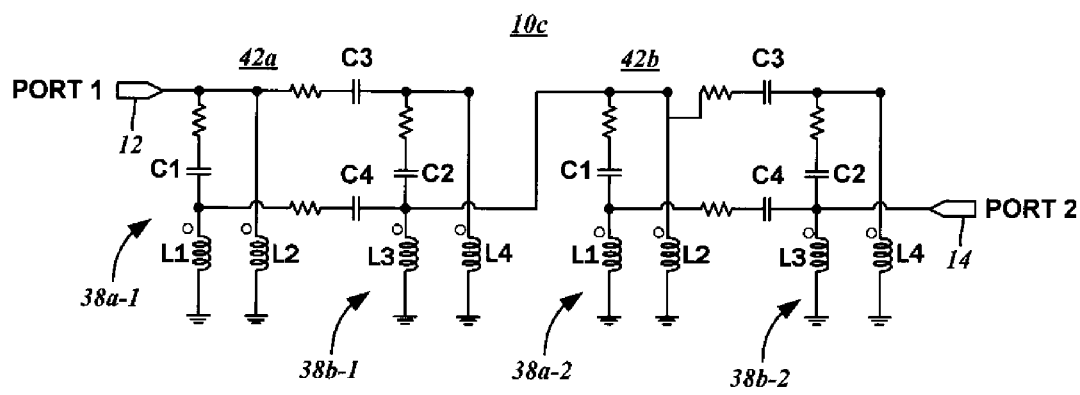
FIG. 8 is a schematic diagram of a first variation of a cascaded coupled resonator filter.

Referring now to the schematic diagram of FIG. 8, a third embodiment of the coupled resonator filter 10c is understood to be comprised of a first stage 42a and a second stage 42b, both of which are identically configured. As will be discussed below, there are variations in the way the first stage 42a and the second stage 42b are interconnected, with the first variant thereof being the third embodiment 10c. Both stages are comprised of the first resonator circuit 38a and the second resonator circuit 38b. As described above, the first resonator circuit 38a includes the capacitor C1 and the magnetically coupled inductors L1 and L2. The second resonator circuit 38b includes the capacitor C2 and the magnetically coupled inductors L3 and L4. The first capacitor C1 and the second capacitor C2 have capacitance values of 4.3 pF, with a resistive component of 0.2 Ohm. All of the inductors L1-L4 in each stage 42 have an inductance value of 0.5 nH, and a resistive component of 0.1 Ohm. The first pair of coupled inductors L1 and L2 has a coupling coefficient of 0.35, which is the same as that of the second pair of coupled inductors L3 and L4. The first resonator circuit 38a is coupled to the second resonator circuit 38b over the first resonator coupling capacitor C3 and the second resonator coupling capacitor C4, both of which have a capacitance value of 3 pF and a resistive loss of 0.2 Ohm.

The first stage 42a is cascaded with the second stage 42b. In further detail, the second resonator circuit 38b-1 of the first stage 42a is connected to the first resonator circuit 38a-2 of the second stage 42b. That is, the first node of the third inductor L3 and the second node of the second capacitor C2, each of which are part of the first stage 42a, is connected to the first node of the first capacitor C1, the first node of the second inductor L2, and the first node of the third capacitor C3, each of which are part of the second stage 42b. The first port 12 is connected to the first node of the first capacitor C1, the first node of the second inductor L2, and the first node the third capacitor C3, each of which are part of the first stage 42a. The second port 14 is connected to the second node of the second capacitor C2, the second node of the fourth capacitor C4, and the first node of the third inductor L3, each of which are part of the second stage 42b. The impedance of the first port 12 and the second port 14 is understood to be 50 Ohms.

Figure 9:
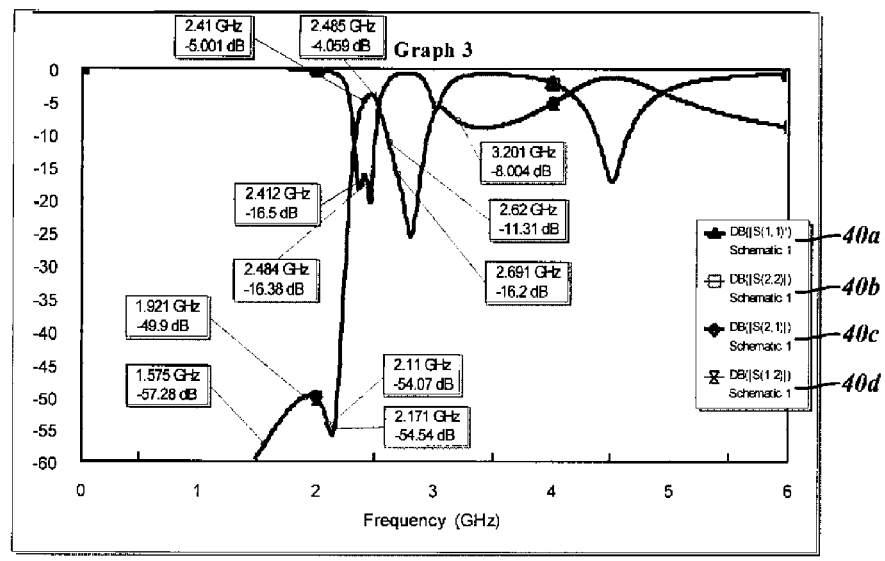
FIG. 9 is a graph plotting the S-parameters of the coupled resonator filter shown in FIG. 8.

This cascaded configuration is envisioned to yield a substantial enhancement in the rejection of spurious signal components in certain cellular communications operating frequencies—in particular, those below 2.17 GHz, as well as GPS receive frequencies in the 1.575 GHz range. It is possible for the rejection levels to exceed 50 dB. Similar input and output return loss performance is expected with respect to the third embodiment of the coupled resonator filter 10c. The graph of FIG. 9 plots the various S-parameters therefor, and includes a first plot 40a showing the input return loss $S_{11}$, a second plot 40b showing the output return loss $S_{22}$, a third plot 40c showing the gain $S_{21}$ and a fourth plot 40d showing the isolation $S_{12}$.

Figure 10:
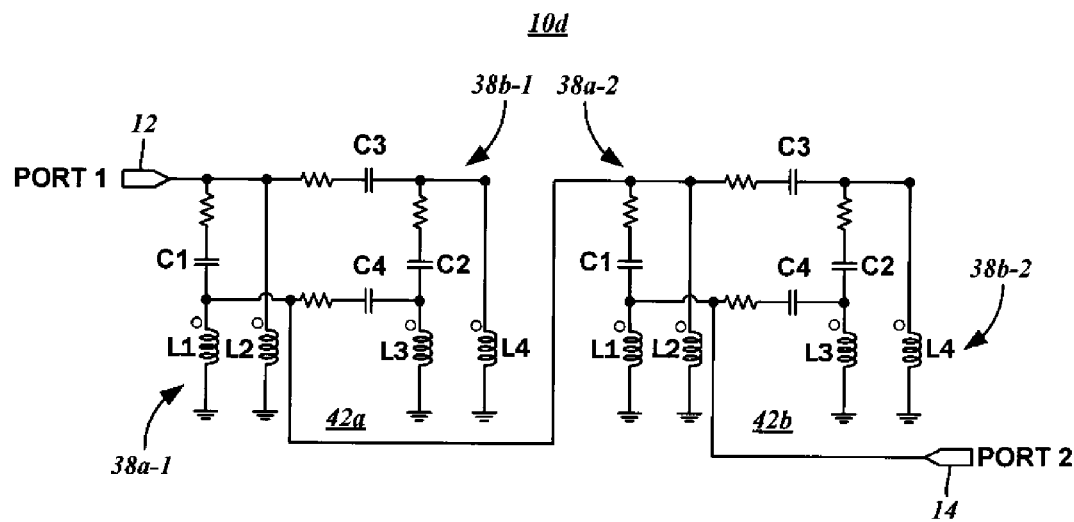
FIG. 10 is a schematic diagram of a second variation of the cascaded coupled resonator filter.

The schematic diagram of FIG. 10 is of a fourth embodiment 10d of the coupled resonator filter, also referred to as a second variation of the cascaded configuration. Similar to the third embodiment 10c, there are two stages 42a, 42b, but as will be described in further detail below, the cascading interconnection between the stages 42 is modified. Again, both of the stages 42a, 42b are identically configured, and are comprised of the first resonator circuit 38a and the second resonator circuit 38b. The first resonator circuit 38a includes the capacitor C1 and the magnetically coupled inductors L1 and L2. The second resonator circuit 38b includes the capacitor C2 and the magnetically coupled inductors L3 and L4. The first capacitor C1 and the second capacitor C2 have capacitance values of 5.2 pF, with a resistive component of 0.2 Ohms. All of the inductors L1-L4 in each stage 42 have an inductance value of 0.5 nH, and a resistive component of 0.1 Ohm. The first pair of coupled inductors L1 and L2 has a coupling coefficient of 0.1, which is the same as that of the second pair of coupled inductors L3 and L4. The first resonator circuit 38a is coupled to the second resonator circuit 38b over the first resonator coupling capacitor C3 and the second resonator coupling capacitor C4, both of which have a capacitance value of 3.5 pF and a resistive loss of 0.2 Ohms.

The first resonator circuit 38a-1 of the first stage 42a is connected to the first resonator circuit 38a-2 of the second stage 42b. That is, the first node of the first inductor L1 and the second node of the first capacitor C1, each of which are part of the first stage 42a, is connected to the first node of the first capacitor C1, the first node of the second inductor L2, and the first node of the third capacitor C3, each of which are part of the second stage 42b. The first port 12 is connected to the first node of the first capacitor C1, the first node of the second inductor L2, and the first node the third capacitor C3, each of which are part of the first stage 42a. The second port 14 is connected to the second node of the first capacitor C1, the first node of the fourth capacitor C4, and the first node of the first inductor L1, each of which are part of the second stage 42b. The impedance of the first port 12 and the second port 14 is 50 Ohms.

Figure 11:
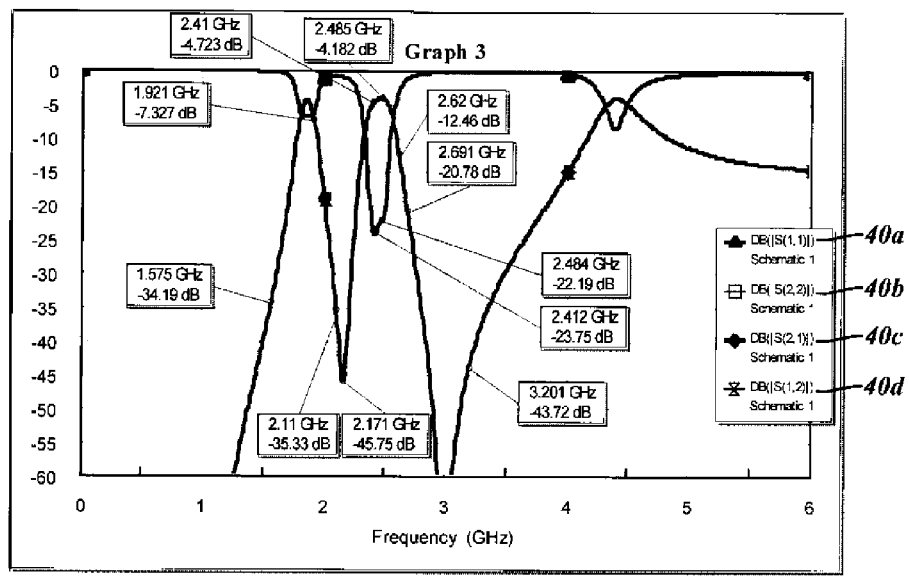
FIG. 11 is a graph plotting the S-parameters of the coupled resonator filter shown in FIG. 10.

This cascaded configuration is envisioned to yield a substantial enhancement in the rejection of spurious signal components in certain cellular communications operating frequencies—in particular, those below 2.17 GHz, GPS receive frequencies in the 1.575 GHz range, and the local oscillator frequency of 3.2 GHz to 3.5 GHz. It is possible for the rejection levels with respect to all of these signal components to exceed 30 dB. Additionally, spurious signal components in yet another cellular communications operating frequency of 2.62 GHz to 2.69 GHz may be rejected at a level higher than 12 dB. Similar input and output return loss performance as with the other embodiments is expected. The graph of FIG. 11 plots the various S-parameters of the fourth embodiment of the coupled resonator filter 10d, and includes a first plot 40a showing the input return loss $S_{11}$, a second plot 40b showing the output return loss $S_{22}$, a third plot 40c showing the gain $S_{21}$ and a fourth plot 40d showing the isolation $S_{12}$.

Figure 12:
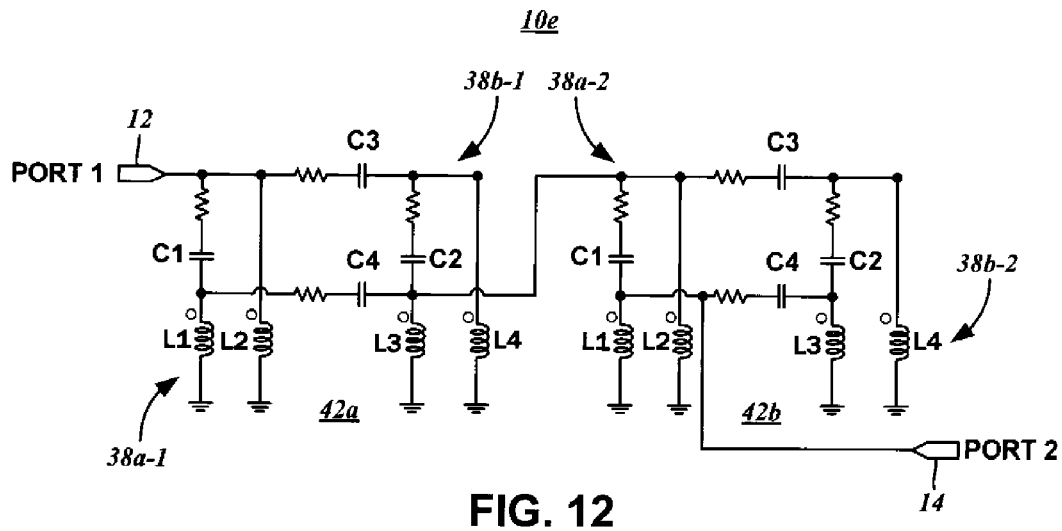
FIG. 12 is a schematic diagram of a third variation of the cascaded coupled resonator filter.

The schematic diagram of FIG. 12 is of a fifth embodiment 10e of the coupled resonator filter, also referred to as a third variant of the cascaded configuration. Similar to the third embodiment 10c and the fourth embodiment 10d discussed above, there are two stages 42a, 42b. However, this embodiment contemplates yet another different cascading interconnection between the stages 42. Both of the stages 42a, 42b are identically configured, and are comprised of the first resonator circuit 38a and the second resonator circuit 38b. The first resonator circuit 38a includes the capacitor C1 and the magnetically coupled inductors L1 and L2. The second resonator circuit 38b includes the capacitor C2 and the magnetically coupled inductors L3 and L4. The first capacitor C1 and the second capacitor C2 have capacitance values of 4.3 pF, with a resistive component of 0.2 Ohms. All of the inductors L1-L4 in each stage 42 have an inductance value of 0.5 nH, and a resistive component of 0.1 Ohm. The first pair of coupled inductors L1 and L2 has a coupling coefficient of 0.35, which is the same as that of the second pair of coupled inductors L3 and L4. The first resonator circuit 38a is coupled to the second resonator circuit 38b over the first resonator coupling capacitor C3 and the second resonator coupling capacitor C4, both of which have a capacitance value of 3 pF and a resistive loss of 0.2 Ohms.

The two stages 42 are interconnected as follows. As with the other embodiments, the first port 12 is connected to the first resonator circuit 38a-1 of the first stage 42, that is, to the first node of the first capacitor C1, the first node of the second inductor L2, and the first node of the third capacitor or the first resonator coupling capacitor C3. The first stage 42a, and specifically the second resonator circuit 38b-1 thereof, is connected to the first resonator circuit 38a-2 of the second stage 42b. In further detail, the second node of the second capacitor C2, the first node of the first inductor L3, and the first node of the fourth capacitor C4, each of which are part of the first stage 42a, is connected to a first node of the first capacitor C1, the first node of the second inductor L2, and the first node of the third capacitor C3 that are part of the second stage 42b. The second port 14, in turn, is connected to the first resonator circuit 38a-2 of the second stage, that is, the first node of the first inductor L1, the first node of the fourth capacitor C4, and the second node of the first capacitor C1, each of which are part of the second stage 42b. The impedance of the first port 12 and the second port 14 is 50 Ohms.

Figure 13:
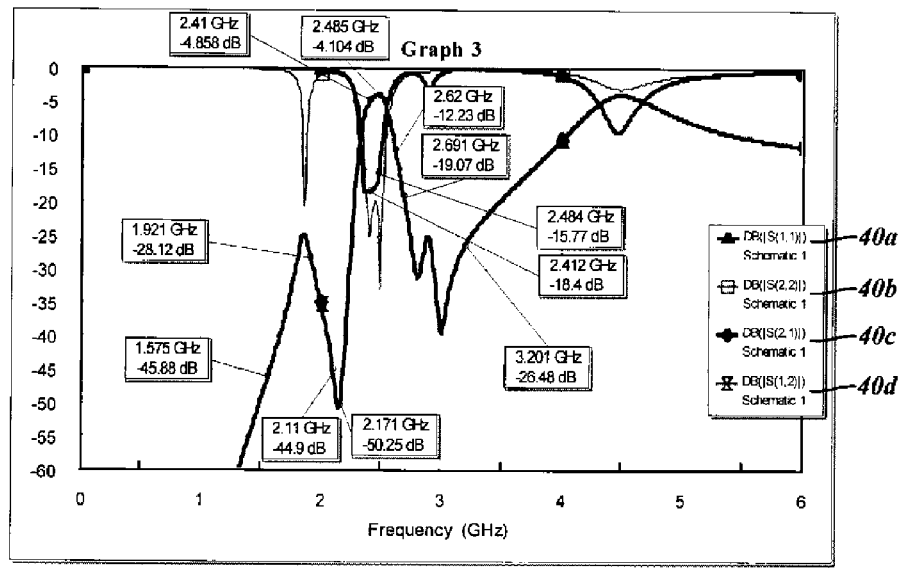
FIG. 13 is a graph plotting the S-parameters of the coupled resonator filter shown in FIG. 12.

This modified cascaded configuration is envisioned to likewise yield a substantial enhancement in the rejection of spurious signal components in certain cellular communications operating frequencies—in particular, those below 2.17 GHz, GPS receive frequencies in the 1.575 GHz range, and the local oscillator frequency of 3.2 GHz to 3.5 GHz. It is possible for the rejection levels with respect to all of these signal components to exceed 20 dB. Additionally, spurious signal components in a different cellular communications operating frequency band of 2.62 GHz to 2.69 GHz may be rejected at a level higher than 12 dB. Still further, the rejection of signal components in the cellular communications operating frequency band below 1.98 GHz may be higher than 25 dB. Similar input and output return loss performance as with the other embodiments is expected. The graph of FIG. 13 plots the various S-parameters of the fourth embodiment of the coupled resonator filter 10d, and includes a first plot 40a showing the input return loss $S_{11}$, a second plot 40b showing the output return loss $S_{22}$, a third plot 40c showing the gain $S_{21}$ and a fourth plot 40d showing the isolation $S_{12}$.

Figure 14:
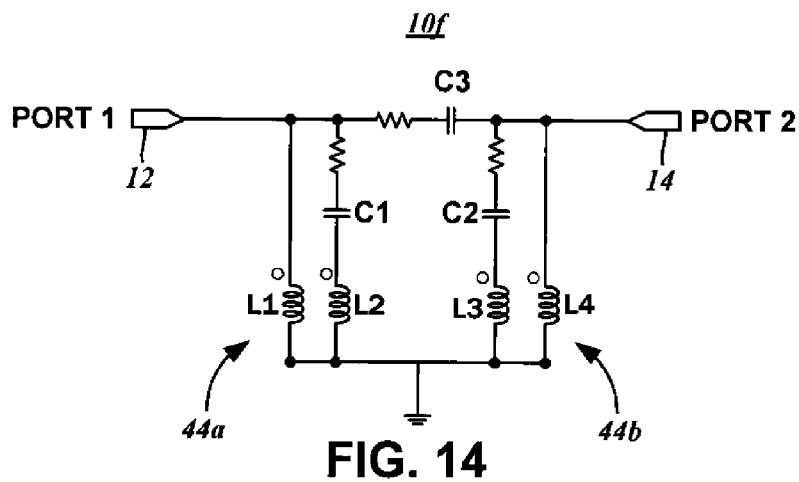
FIG. 14 is a schematic diagram of a sixth embodiment of the coupled resonator filter configured for a 5 GHz WLAN input signal.

The schematic diagram of FIG. 14 depicts yet another embodiment 10f of the coupled resonator filter, which is particularly configured for use in connection with a 5 GHz WLAN communications system. Again, the coupled resonator filter 10f includes the first port 12 and the second port 14, either of which may be designated as the input port or the output port. The first port 12 is connected to a first node of a first inductor L1, as well as a first node of the capacitor C1, and a first node of a third capacitor C3. Furthermore, the second port 14 is connected to a first node of a fourth inductor L4, a first node of a second capacitor C2, and a second node of the third capacitor C3. A first node of the second inductor L2 is connected to a second node of the first capacitor C1. A first node of a third inductor L3 is connected to a second node of the second capacitor C2. Second nodes of each of the first inductor L1, the second inductor L2, the third inductor L3, and the fourth inductor L4 are connected to ground. The impedance of the first port 12 may be 50

Ohms, and the impedance of the second port 14 may be 30 Ohms. Again, the resistors shown connected to the capacitors C1-C4 are understood to be associated with resistive losses thereof, rather than separate resistor components. A typical resistive loss for these capacitors in one implementation of the coupled resonator filter 10 is understood to be 1 Ohm.

The first inductor L1, the second inductor L2, and the first capacitor C1 are understood to comprise a first resonator circuit 44a, while the third inductor L3, the fourth inductor 14, and the second capacitor C2 are understood to comprise a second resonator circuit 44b. The capacitors C1, C2 in the resonator circuits 44 may have a capacitance value of 1 pF. The first resonator circuit 44a is coupled to the second resonator circuit 44b by the third capacitor C3, also referred to as a resonator coupling capacitor. With the first port 12 being connected to the first resonator circuit 44a, and the second port 14 being connected to the second resonator circuit 44b, the input signal is coupled from the first resonator circuit 44a to the second resonator circuit 44b by the coupling capacitor C3. In one implementation of the coupled resonator filter 10, the resonator coupling capacitor C3 has a capacitance value of 0.8 pF.

The two inductors L1 and L2 in the first resonator circuit 44a are magnetically coupled between coils thereof. In accordance with one embodiment, the coupling coefficient between these two inductors K1_2 is 0.35. The two inductors L3, L4 in the second resonator circuit 44b are likewise magnetically coupled between coils thereof, with a coupling coefficient K3_4 being 0.35. There is no coupling between the inductors of the first resonator circuit 44a and the second resonator circuit 44b, e.g., the coupling coefficient between the first inductor L1 and the third inductor L3 or the fourth inductor L4 is zero, the coupling coefficient between the second inductor L2 and the third inductor L3 or the fourth inductor L4 is zero, and so forth. Each of the inductors L1, L2, L3, and L4 may have an inductance value of 0.5 nH with a resistive loss of 0.1 Ohm. Depending on which of the first port 12 or the second port 14 is the signal input, the first inductor L1 or the third inductor L3 may additionally serve an electrostatic discharge function when implemented on-die. Along these lines, the general implementation/fabrication considerations for the coupled resonator filter 10 are understood to apply to the sixth embodiment 10f.

Although specific values of the components of the coupled resonator filter 10f are provided, these are understood to be by way of example only and not of limitation. The circuit may be tuned for other applications with different component values. The circuit component values are selected in such a manner that input signal components in the 2.4 GHz WLAN operating frequency band, e.g., 2.412 GHz to 2.484 GHz, as well as the cellular communications operating frequencies lower than 2.17 GHz, and the GPS reception frequency in the 1.575 GHz range, there is a high level of rejection. In the illustrated embodiment, rejection of these frequency components of more than 30 dB is possible. Additionally, the circuit component values are selected to also reject input signal components in a different part of the spectrum of cellular communications operating frequencies in the 2.62 GHz to 2.69 GHz range at more than 20 dB. The rejection of local oscillator frequencies in the 3.5 GHz to 3.9 GHz range, as well as the 6.8 GHz to 7.8 GHz range is also contemplated to be higher than 10 dB. Beyond these spurious emission rejection characteristics, the components of the coupled resonator filter 10f configured for the 5 GHz WLAN operating frequency are selected so that insertion loss at such frequency is less than 2 dB.

Figure 15:
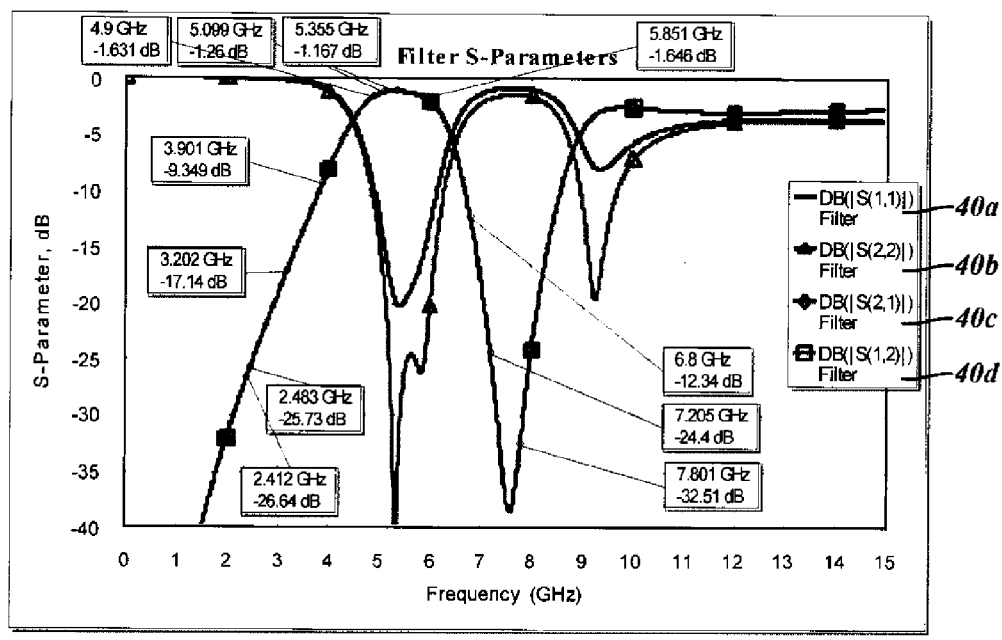
FIG. 15 is a graph plotting the S-parameters of the coupled resonator filter shown in FIG. 14.

The graph of FIG. 15 plots the various S-parameters of the sixth embodiment of the coupled resonator filter 10f. A first plot 40a shows the input return loss $S_{11}$, a second plot 40b shows the output return loss $S_{22}$, a third plot 40c shows the gain $S_{21}$ and a fourth plot 40d shows the isolation $S_{12}$. Across various embodiments of the coupled resonator filter 10 configured for the 5 GHz WLAN operating frequency, the input return loss $S_{ii}$ and the output return loss $S_{22}$ are both less than −10 dB.

Figure 16:
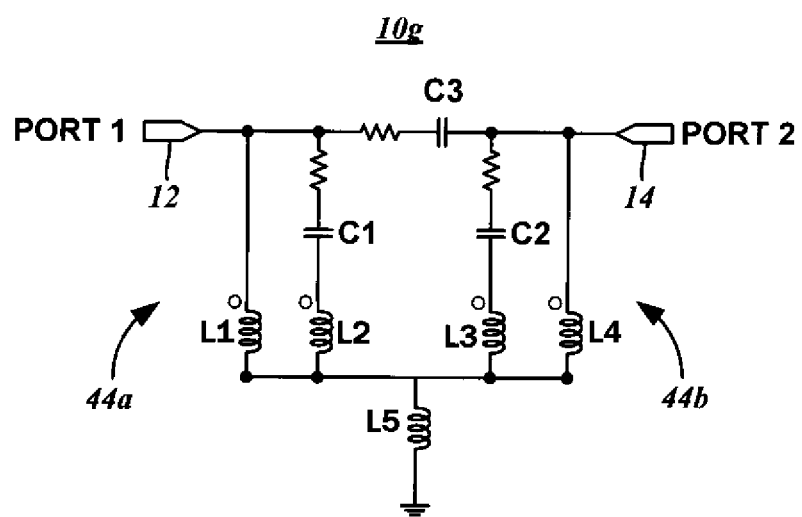
FIG. 16 is a schematic diagram of a seventh embodiment of the coupled resonator filter including a common inductor.

Referring now to the schematic of FIG. 16, a seventh embodiment of the coupled resonator filter 10g contemplates an almost identical configuration as the sixth embodiment 10f, including the first resonator circuit 44a comprised of the capacitor C1 and the magnetically coupled inductors L1 and L2, and the second resonator circuit 44b comprised of the capacitor C2 and the magnetically coupled inductors L3 and L4. The first capacitor C1 and the second capacitor C2 have capacitance values of 1 pF, with a resistive component of 1 Ohm. All of the inductors L1-L4 have an inductance value of 0.5 nH, and a resistive component of 0.1 Ohm. The first pair of coupled inductors L1 and L2 has a coupling coefficient of 0.35, as does the second pair of coupled inductors L3 and L4. The first resonator circuit 38a is coupled to the second resonator circuit 38b over the first resonator coupling capacitor C3, which has a capacitance value of 0.8 pF and a resistive loss of 1 Ohm. The impedance at the first port 12 is understood to be 50 Ohms, while the impedance at the second port 14 is understood to be 30 Ohms.

The seventh embodiment of the coupled resonator filter 10g further includes a fifth inductor L5 that is connected to the second nodes of each of the inductors L1, L2, L3, and L4. This fifth inductor L5, also referred to as a common inductor, may exist by virtue of the particular fabrication/packaging that is selected. In some cases, this may be a bond wire, or a solder ball, or a copper pillar.

Figure 17:
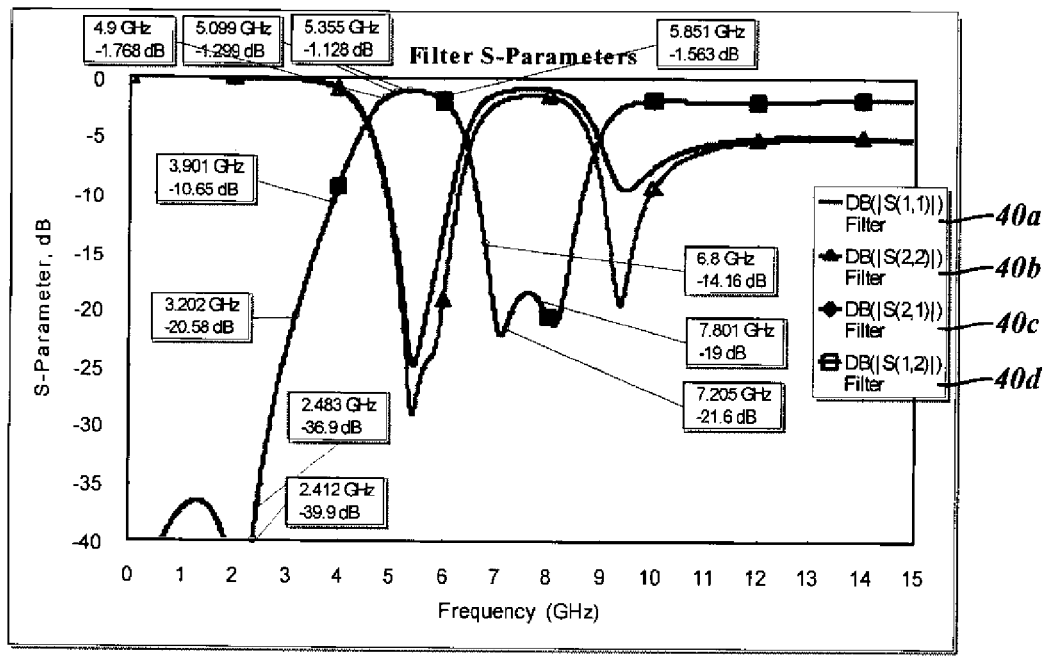
FIG. 17 is a graph plotting the S-parameters of the coupled resonator filter shown in FIG. 16 with an output impedance of 30 Ohms.
Figure 18:
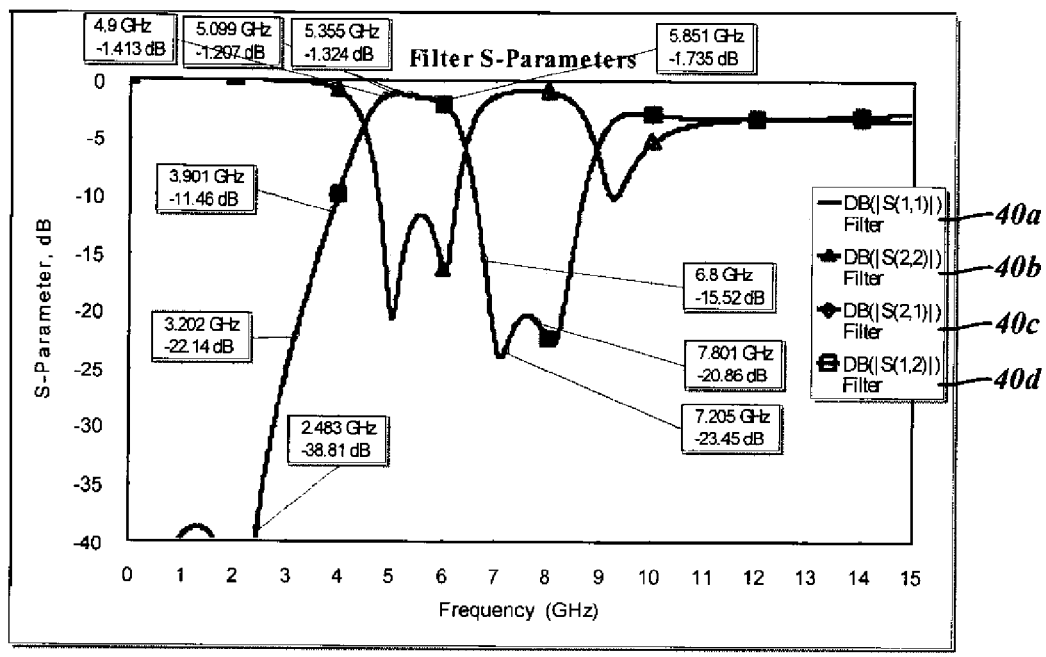
FIG. 18 is a graph plotting the S-parameters of the coupled resonator filter shown in FIG. 16 with an output impedance of 50 Ohms.

The graph of FIG. 17 plots the various S-parameters of the seventh embodiment of the coupled resonator filter 10g. A first plot 40a shows the input return loss $S_{11}$, a second plot 40b shows the output return loss $S_{22}$, a third plot 40c shows the gain $S_{21}$ and a fourth plot 40d shows the isolation $S_{12}$. The graph of FIG. 18 plots the S-parameters for a variation of the seventh embodiment 10g in which the impedance at the second port 14 is selected to be 50 Ohms rather than 30 Ohms in the sixth embodiment 10f. Again, the first plot 40a shows the input return loss $S_{11}$, a second plot 40b shows the output return loss $S_{22}$, a third plot 40c shows the gain $S_{21}$ and a fourth plot 40d shows the isolation $S_{12}$.

Figure 19:
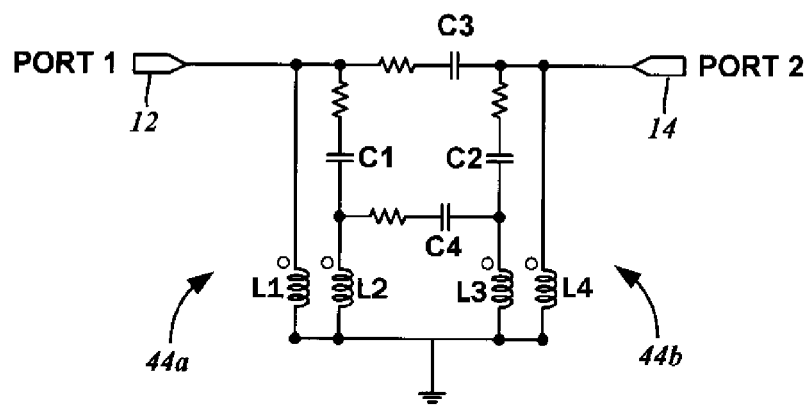
FIG. 19 is a schematic diagram of an eighth embodiment of the coupled resonator filter.

The schematic diagram of FIG. 19 is of an eighth embodiment of the coupled resonator filter 10h which is similar to the configuration of the first embodiment 10a, including the first resonator circuit 44a comprised of the capacitor C1 and the magnetically coupled inductors L1 and L2, and the second resonator circuit 44b comprised of the capacitor C2 and the magnetically coupled inductors L3 and L4. The first capacitor C1 and the second capacitor C2 have capacitance values of 0.95 pF, with a resistive component of 1 Ohm. All of the inductors L1-L4 have an inductance value of 0.5 nH, and a resistive component of 0.1 Ohm. The first pair of coupled inductors L1 and L2 has a coupling coefficient of 0.35, as does the second pair of coupled inductors L3 and L4. The first resonator circuit 38a is coupled to the second resonator circuit 38b over the first resonator coupling capacitor C3, and the second resonator coupling capacitor C4. The first resonator coupling capacitor or third capacitor C3 has a capacitance value of 0.75 pF, and the second resonator coupling capacitor or fourth capacitor C4 has a capacitance value of 0.85 pF. Both of these capacitors have a resistive loss of 1 Ohm.

The first port 12 is connected to the first resonator circuit 44a, and particularly at the first node of the first inductor L1, the first node of the first capacitor C1, and the first node of the third capacitor C3. The second port 14 is connected to the second resonator circuit 44b, though at a junction defined by the first node of the fourth inductor 14, the first node of the second capacitor C2, and the second node of the third capacitor C3. The impedance at the first port 12 and the second port 14 is understood to be 50 Ohms.

The selection of the values of the circuit components is made in such a manner that input signal components in the 2.4 GHz WLAN operating frequency band, e.g., 2.412 GHz to 2.484 GHz, have a high level of rejection, e.g., greater than 25 dB. Furthermore the cellular communications operating frequencies lower than 2.17 GHz and the GPS reception frequency in the 1.575 GHz range have similarly high levels of rejection at greater than 30 dB. The rejection of local oscillator frequencies in the 3.5 GHz to 3.9 GHz range, as well as the 6.8 GHz to 7.8 GHz is also contemplated to be higher than 10 dB. Beyond these spurious emission rejection characteristics, the components of the coupled resonator filter 10h configured for the 5 GHz WLAN operating frequency are selected so that insertion loss at such frequency is less than 2 dB.

Figure 20:
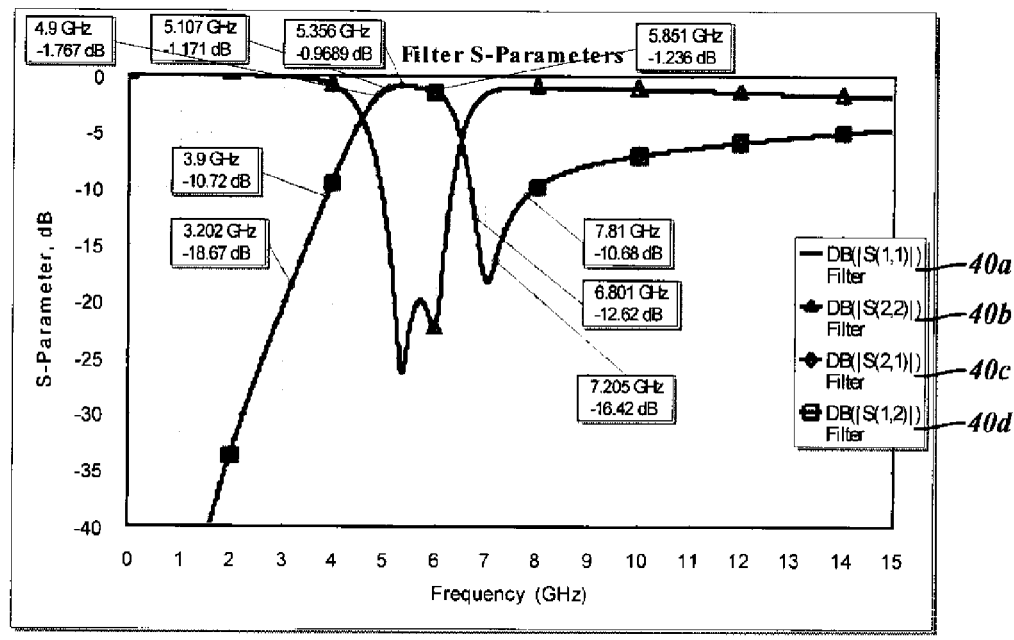
FIG. 20 is a graph plotting the S-parameters of the eighth embodiment of the coupled resonator filter shown in FIG. 19.

The graph of FIG. 20 plots the various S-parameters of the eighth embodiment of the coupled resonator filter 10h. A first plot 40a shows the input return loss $S_{11}$, a second plot 40b shows the output return loss $S_{22}$, a third plot 40c shows the gain $S_{21}$ and a fourth plot 40d shows the isolation $S_{12}$. Across various embodiments of the coupled resonator filter 10 configured for the 5 GHz WLAN operating frequency, the input return loss $S_{11}$ and the output return loss $S_{22}$ are both less than −10 dB.

Figure 21:
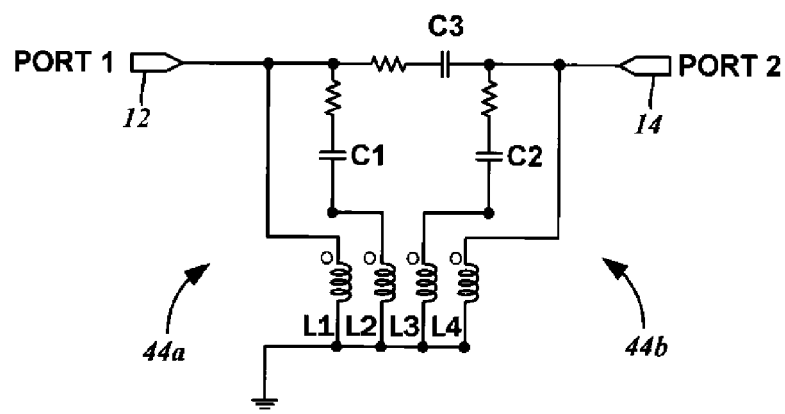
FIG. 21 is a schematic diagram of a ninth embodiment of the coupled resonator filter in which coupled inductor pairs are also coupled to each other.

The schematic diagram of FIG. 21 depicts a ninth embodiment of the coupled resonator filter 10i, which is substantially the same as the sixth embodiment 10f discussed above. More particularly, the coupled resonator filter 10i includes the first resonator circuit 44a with the capacitor C1 and the magnetically coupled inductors L1 and L2, and the second resonator circuit 44b comprised of the capacitor C2 and the magnetically coupled inductors L3 and L4. The first capacitor C1 and the second capacitor C2 have capacitance values of 1 pF, with a resistive component of 1 Ohm. All of the inductors L1-L4 have an inductance value of 0.5 nH, and a resistive component of 0.1 Ohm. The first resonator circuit 44a is coupled to the second resonator circuit 44b over the resonator coupling capacitor C3, also referred to as the third capacitor, and has a capacitance value of 0.8 pF and a resistive loss of 1 Ohm.

Unlike the previously discussed embodiments of the coupled resonator filters 10, however, each of the inductors L1-L4 is magnetically coupled to each other. Again, the first pair of coupled inductors L1 and L2 has a coupling coefficient K1_2 of 0.35, as does the second pair of coupled inductors L3 and L4, as given by K3_4. The first inductor L1 is also magnetically coupled to the third inductor L3, and has a coupling coefficient K1_3 of 0.25. The second inductor L2 is magnetically coupled to the fourth inductor L4 and has a coupling coefficient K2_4 of 0.25. The second inductor is magnetically coupled to the third inductor L3, and has a coupling coefficient K2_3 of 0.35, being positioned the most closely to each other. Finally, the first inductor L1 is magnetically coupled to the fourth inductor L4, with a coupling coefficient K1_4 of 0.15, being positioned with the most distance to each other.

The first port 12 is connected to the first resonator circuit 44a, and particularly at the first node of the first inductor L1, the first node of the first capacitor C1, and the first node of the third capacitor C3. The second port 14 is connected to the second resonator circuit 44b, though at a junction defined by the first node of the fourth inductor 14, the first node of the second capacitor C2, and the second node of the third capacitor C3. The impedance at the first port 12 may be 50 Ohms, while the impedance at the second port 14 may be 25 Ohms.

The circuit component values are selected in such a manner that input signal components in the 2.4 GHz WLAN operating frequency band, e.g., 2.412 GHz to 2.484 GHz, as well as the cellular communications operating frequencies lower than 2.17 GHz, and the GPS reception frequency in the 1.575 GHz range, there is a high level of rejection. In the illustrated embodiment, rejection of these frequency components of more than 30 dB is possible. The rejection of local oscillator frequencies in the 3.5 GHz to 3.9 GHz range, as well as the 6.8 GHz to 7.8 GHz range is also contemplated to be higher than 10 dB. The second harmonic of the 5 GHz transmitter, e.g., 9.8 GHz to 11.7 GHz can also be rejected on the order of 5 dB to 10 dB. Beyond these spurious emission rejection characteristics, the components of the coupled resonator filter 10i configured for the 5 GHz WLAN operating frequency are selected so that insertion loss at such frequency is less than 2 dB.

Figure 22:
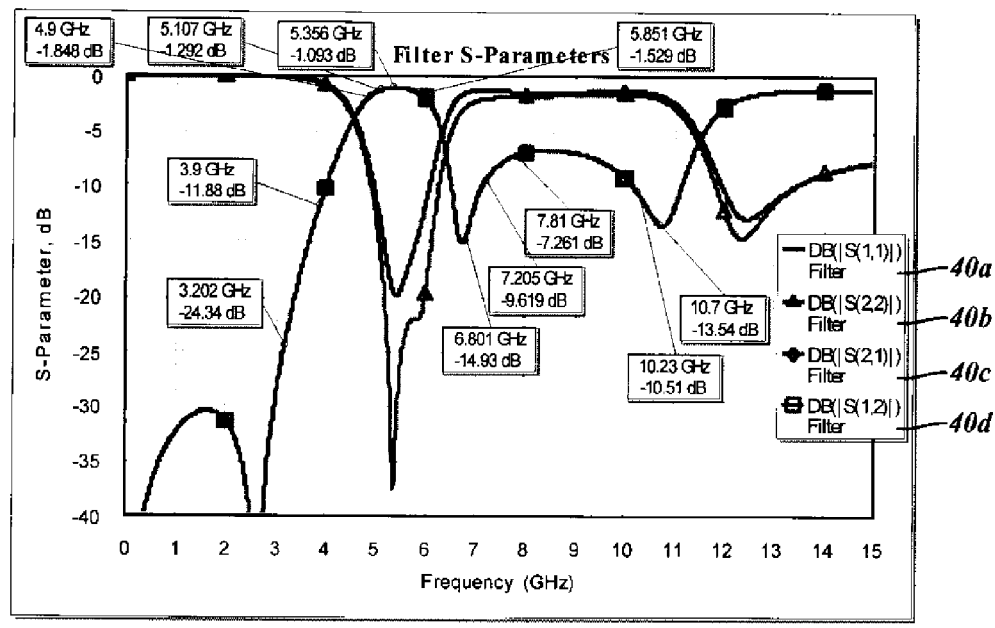
FIG. 22 is a graph plotting the S-parameters of the ninth embodiment of the coupled resonator filter shown in FIG. 21.

The graph of FIG. 22 plots the various S-parameters of the ninth embodiment of the coupled resonator filter 10i. A first plot 40a shows the input return loss $S_{11}$, a second plot 40b shows the output return loss $S_{22}$, a third plot 40c shows the gain $S_{21}$ and a fourth plot 40d shows the isolation $S_{12}$. Across various embodiments of the coupled resonator filter 10 configured for the 5 GHz WLAN operating frequency, the input return loss $S_{11}$ and the output return loss $S_{22}$ are both less than −10 dB.

Figure 23:
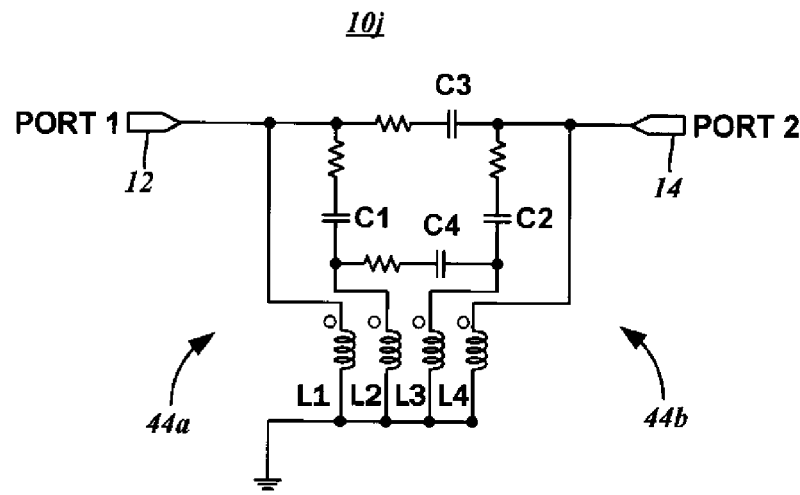
FIG. 23 is a schematic diagram of a tenth embodiment of the coupled resonator filter including an additional resonator coupling capacitor.

The schematic diagram of FIG. 23 shows a tenth embodiment 10j of the coupled resonator filter. As shown, the tenth embodiment 10j is similar to the eighth and ninth embodiments of the coupled resonator filter 10h, 10i discussed above. It was described that the first resonator circuit 44a is coupled to the second resonator circuit 44b with the first resonator coupling capacitor C3, also referred to as the third capacitor. Additionally, there is the second resonator coupling capacitor C4, i.e., the fourth capacitor that also couples the first resonator circuit 44a to the second resonator circuit 44b. In further detail, the first node of the fourth capacitor C4 is connected to the first node of the second inductor L2 and the second node of the first capacitor C1. Furthermore, the second node of the fourth capacitor C4 is connected to the first node of the third inductor L3 and the second node of the second capacitor C2. The fourth capacitor C4 has a capacitance value of 0.28 pF, while the third capacitor C3 has a capacitance value of 0.8 pF. The first capacitor C1 in the first resonator circuit 44a has a capacitance value of 0.98 pF, and the second capacitor C2 in the second resonator circuit 44b has a capacitance value of 1.01 pf. Each of the capacitors in the tenth embodiment 10j is understood to have a resistive loss of 1 Ohm.

As indicated above in relation to the ninth embodiment 10i, each of the inductors L1, L2, L3, and L4 are magnetically coupled to each other. The same inductor values and coupling coefficients set forth above in relation to the ninth embodiment 10i are also applicable to this embodiment.

Figure 24:
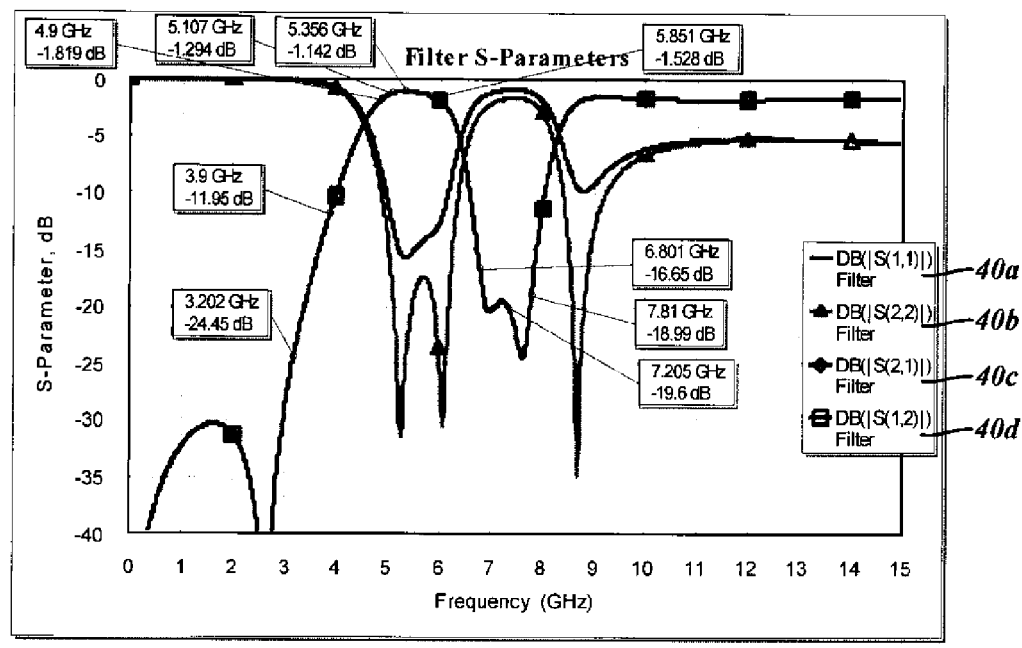
FIG. 24 is a graph plotting the S-parameters of the tenth embodiment of the coupled resonator filter shown in FIG. 23.

The implementation of the second resonator coupling capacitor C4 is envisioned to increase the level of rejection at the local oscillator frequencies of the transceiver. This is understood to encompass the frequency range of 6.8 GHz to 7.8 GHz. The rejection level may be greater than 15 dB. The graph of FIG. 24 plots the various S-parameters of the tenth embodiment of the coupled resonator filter 10*j*. A first plot 40*a* shows the input return loss $S_{11}$, a second plot 40*b* shows the output return loss $S_{22}$, a third plot 40*c* shows the gain $S_{21}$ and a fourth plot 40*d* shows the isolation $S_{12}$.

Figure 25:
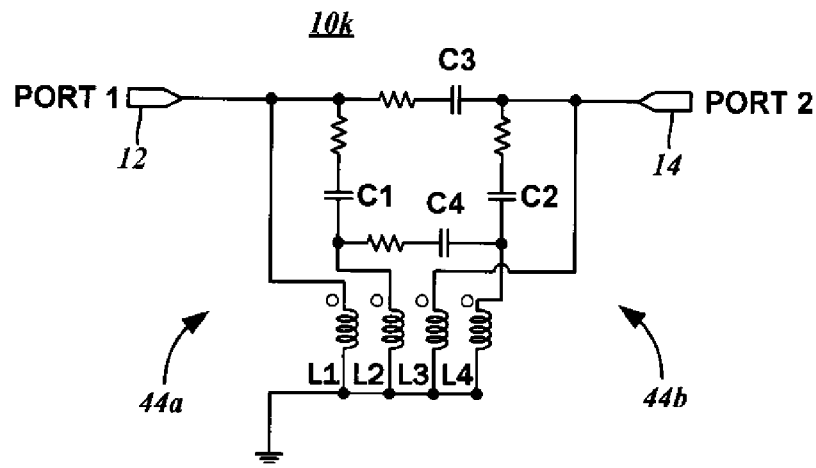
FIG. 25 is a schematic diagram of an eleventh embodiment of the coupled resonator filter with an alternative connection of the second port.

The schematic diagram of FIG. 25 depicts an eleventh embodiment 10*k* of the coupled resonator filter that is particularly configured for use in connection with a 5 GHz WLAN communications system. The coupled resonator filter 10*k* includes the first port 12 and the second port 14, either of which may be designated as the input port or the output port. The first port 12 is connected to a first node of a first inductor L1, as well as a first node of the capacitor C1, and a first node of a third capacitor C3. Furthermore, the second port 14 is connected to a first node of a third inductor L3, a first node of a second capacitor C2, and a second node of the third capacitor C3. A first node of the second inductor L2 is connected to a second node of the first capacitor C1. A first node of a fourth inductor L4 is connected to a second node of the second capacitor C2 and the second node of the fourth capacitor C4. Second nodes of each of the first inductor L1, the second inductor L2, the third inductor L3, and the fourth inductor L4 are connected to ground. The impedance of the first port 12 may be 50 Ohms, and the impedance of the second port 14 may be 30 Ohms. The resistors shown connected to the capacitors C1-C4 are understood to be associated with resistive losses thereof, rather than separate resistor components. A typical resistive loss for these capacitors in one implementation of the coupled resonator filter 10 is understood to be 1 Ohm.

The first inductor L1, the second inductor L2, and the first capacitor C1 are understood to comprise a first resonator circuit 44*a*, while the third inductor L3, the fourth inductor 14, and the second capacitor C2 are understood to comprise a second resonator circuit 44*b*. The capacitor C1 in the first resonator circuit 44*a* may have a capacitance value of 1.01 pF, and the capacitor C2 in the second resonator circuit 44*b* may have a capacitance value of 1.05 pF. The first resonator circuit 44*a* is coupled to the second resonator circuit 44*b* by the third capacitor C3, also referred to as a first resonator coupling capacitor, as well as by the fourth capacitor C4, referred to as a second resonator coupling capacitor. With the first port 12 being connected to the first resonator circuit 44*a*, and the second port 14 being connected to the second resonator circuit 44*b*, the input signal is coupled from the first resonator circuit 44*a* to the second resonator circuit 44*b* by the coupling capacitors C3, C4. The first resonator coupling capacitor C3 may have a capacitance value of 0.85 pF, and the second resonator coupling capacitor C4 may have a capacitance value of 0.18 pF.

Each of the inductors L1-L4 is magnetically coupled to each other. The first pair of coupled inductors L1 and L2 has a coupling coefficient K1_2 of 0.35, as does the second pair of coupled inductors L3 and L4, as given by K3_4. The first inductor L1 is also magnetically coupled to the third inductor L3, and has a coupling coefficient K1_3 of 0.25. The second inductor L2 is magnetically coupled to the fourth inductor L4 and has a coupling coefficient K2_4 of 0.25. The second inductor is magnetically coupled to the third inductor L3, and has a coupling coefficient K2_3 of 0.35, being positioned the most closely to each other. Finally, the first inductor 11 is magnetically coupled to the fourth inductor L4, with a coupling coefficient K1_4 of 0.15, being positioned with the most distant to each other. Each of the inductors L1, L2, L3, and L4 may have an inductance value of 0.5 nH with a resistive loss of 0.05 Ohm. Depending on which of the first port 12 or the second port 14 is the signal input, the first inductor L1 or the third inductor L3 may additionally serve an electrostatic discharge function when implemented on-die. Along these lines, the general implementation/fabrication considerations for the coupled resonator filter 10 discussed above is understood to be applicable with this embodiment.

The circuit component values are selected in such a manner that input signal components in the 2.4 GHz WLAN operating frequency band, e.g., 2.412 GHz to 2.484 GHz, as well as the cellular communications operating frequencies lower than 2.17 GHz, in the 2.62 GHz to 2.69 GHz range, and the GPS reception frequency in the 1.575 GHz range, there is a high level of rejection. In the illustrated embodiment, rejection of these frequency components of more than 25 dB is possible. The rejection of local oscillator frequencies in the 3.5 GHz to 3.9 GHz range, as well as the 6.8 GHz to 7.8 GHz range is also contemplated to be higher than 17 dB. Beyond these spurious emission rejection characteristics, the components of the coupled resonator filter 10*f* configured for the 5 GHz WLAN operating frequency are selected so that insertion loss at such frequency is less than 2.5 dB.

Figure 26:
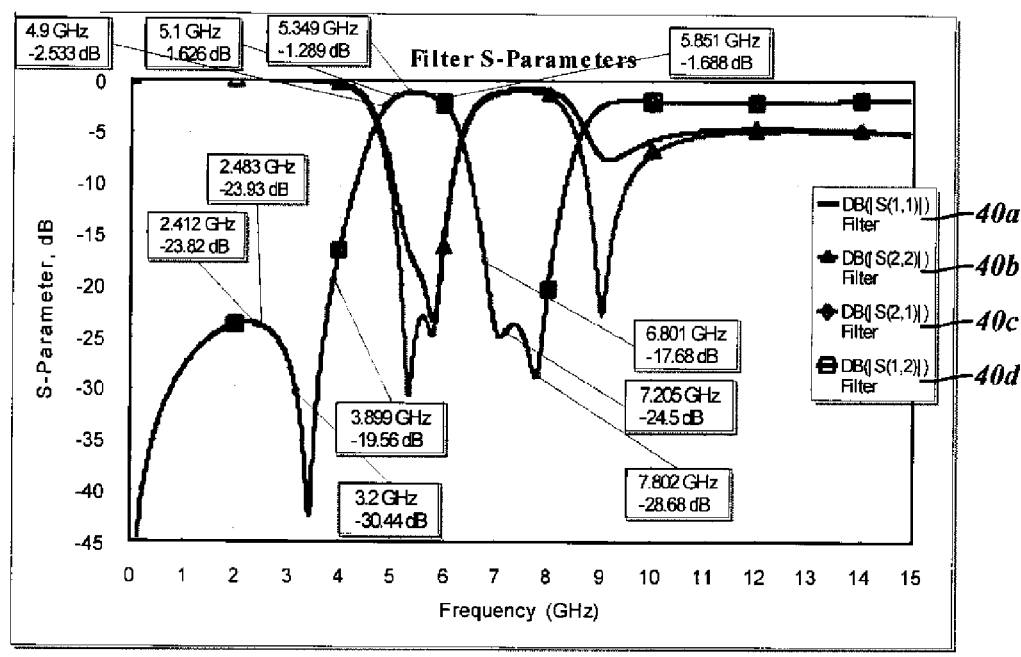
FIG. 26 is a graph plotting the S-parameters of the eleventh embodiment of the coupled resonator filter shown in FIG. 25.

The graph of FIG. 26 plots the various S-parameters of the eleventh embodiment of the coupled resonator filter 10*k*. A first plot 40*a* shows the input return loss $S_{11}$, a second plot 40*b* shows the output return loss $S_{22}$, a third plot 40*c* shows the gain $S_{21}$ and a fourth plot 40*d* shows the isolation $S_{12}$. Across various embodiments of the coupled resonator filter 10 configured for the 5 GHz WLAN operating frequency, the input return loss $S_{11}$ and the output return loss $S_{22}$ are both less than −10 dB.

Figure 27:
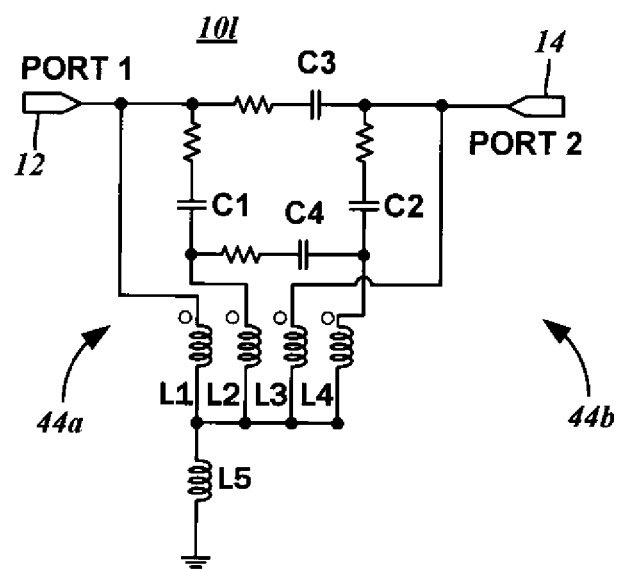
FIG. 27 is a schematic diagram of a twelfth embodiment of the coupled resonator filter with an additional common inductor.

With reference to FIG. 27, a twelfth embodiment of the coupled resonator filter 10*l* further includes a fifth inductor L5 that is connected to the second nodes of each of the inductors L1, L2, L3, and L4. This fifth inductor L5, also referred to as a common inductor, may exist by virtue of the particular fabrication/packaging that is selected. In some cases, this may be a bond wire, or a solder ball, or a copper pillar.

Figure 28:
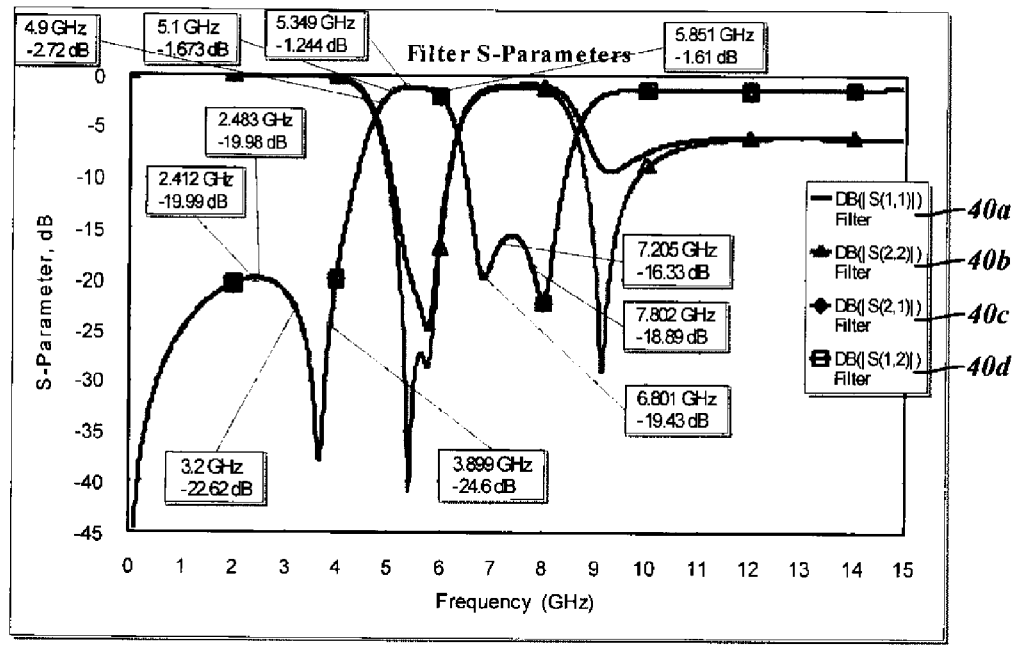
FIG. 28 is a graph plotting the S-parameters of the coupled resonator filter shown in FIG. 27 with an output impedance of 30 Ohms.
Figure 29:
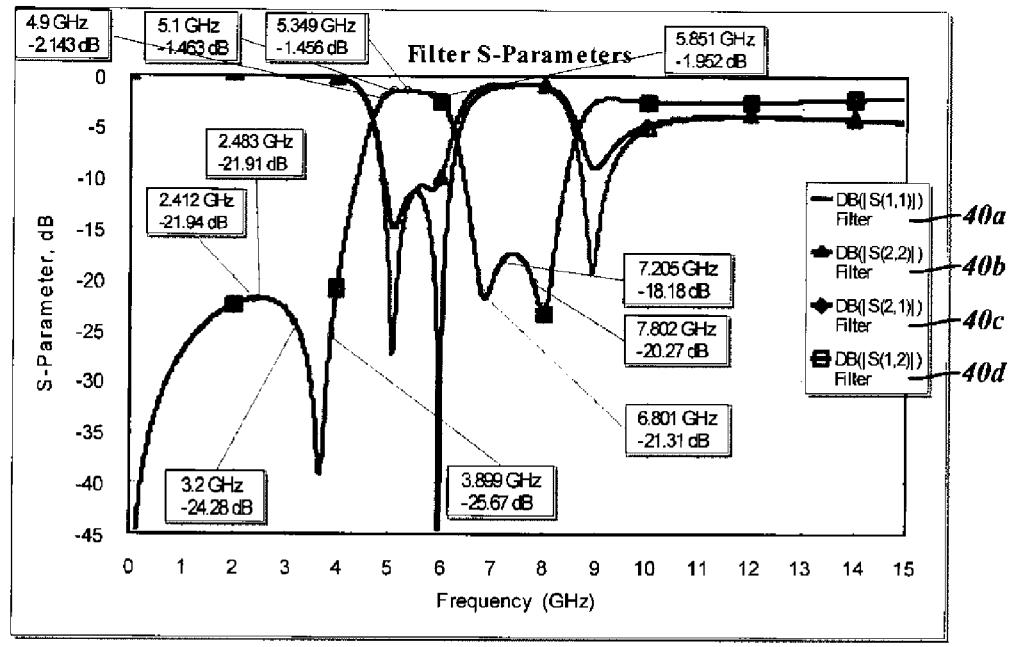
FIG. 29 is a graph plotting the S-parameters of the coupled resonator filter shown in FIG. 27 with an output impedance of 50 Ohms.

The graph of FIG. 28 plots the various S-parameters of the twelfth embodiment of the coupled resonator filter 10*l*. A first plot 40*a* shows the input return loss $S_{11}$, a second plot 40*b* shows the output return loss $S_{22}$, a third plot 40*c* shows the gain $S_{21}$ and a fourth plot 40*d* shows the isolation $S_{12}$. The graph of FIG. 29 plots the S-parameters for a variation of the twelfth embodiment 10*l* in which the impedance at the second port 14 is selected to be 50 Ohms rather than 30 Ohms. Again, the first plot 40*a* shows the input return loss $S_{11}$, a second plot 40*b* shows the output return loss $S_{22}$, a third plot 40*c* shows the gain $S_{21}$ and a fourth plot 40*d* shows the isolation $S_{12}$.

Figure 30:
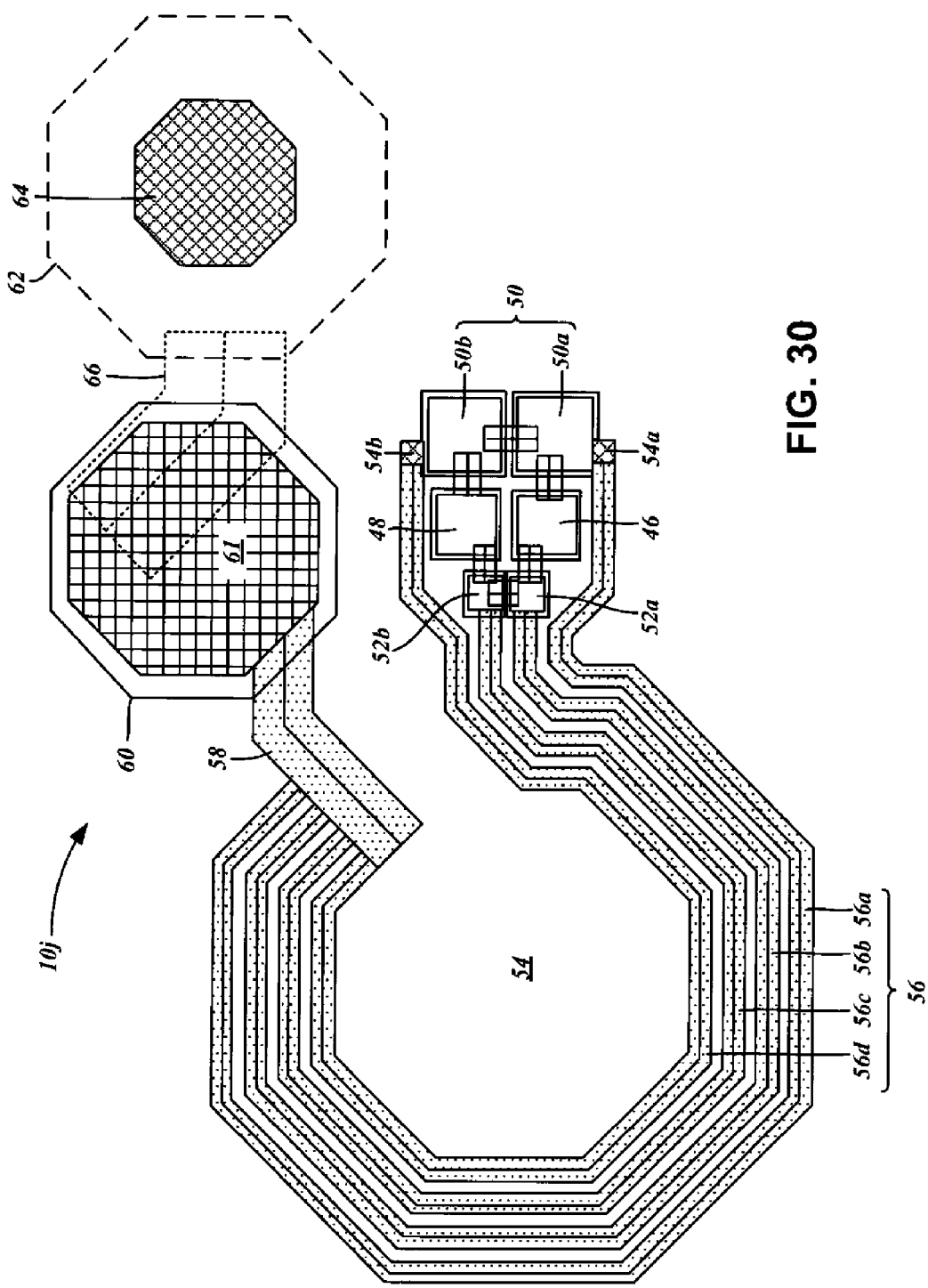
FIG. 30 is a plan view of an exemplary physical layout implementation of the coupled resonator filter based on the tenth embodiment and including an additional common inductor.

Having considered the different embodiments of the coupled resonator filter 10*a*-10*l*, several exemplary physical layout implementations thereof will now be described. Referring to FIG. 30, there is an on-die implementation of a variation of the tenth embodiment of the coupled resonator filter 10*j* together with a flip-chip printed circuit board architecture. Corresponding to the capacitor C1 is a first passive component 46. The capacitor C2 is shown as a second passive component 48, and the capacitor C3 is shown as a multi-part third passive component 50*a*, 50*b*. Similarly, a multi-part fourth passive component 52*a*, 52*b* is understood to correspond to the capacitor C4. As shown, there are various conductive traces interconnecting these passive components as defined by the coupled resonator filter 10. The first port 12 is implemented as a first conductive pad 54a, and the second port 14 is implemented as a second conductive pad 54b. The passive components 48-52, which are capacitors, may be implemented as metal-insulator-metal capacitors as indicated above. This physical layout may also be utilized for the twelfth embodiment 10l of the coupled resonator filter, though with modifications to the location of the second port 14 being disposed on the junction between the fourth passive component 52b and the second passive component 48.

There are a series of conductive traces 56 that connect to the aforementioned passive components 46-52, and further define the inductors L1-L4. A first conductive trace 56a that is connected to the first port 12/first conductive pad 54a and the capacitor C3/third passive component 50a is understood to correspond to the first inductor L1. A second conductive trace 56b that is connected to the fourth capacitor C4/fourth passive component 52a is understood to correspond to the second inductor L2. A third conductive trace 56c that is connected to the fourth capacitor C4/fourth passive component 52b is understood to correspond to the third inductor L3. A fourth conductive trace 56d that is connected to the second port/second conductive pad 54b and the capacitor C3/third passive component 50b is understood to correspond to the fourth inductor L4. The length of each of the conductive traces 56 is understood to represent the self-inductance of that coil. Each of the conductive traces 56 are positioned in close proximity to each other for magnetic coupling, and spirals a single turn around a central region 54. The degree of separation as and between the conductive traces 56 is understood to define the degree of coupling or the coupling coefficient.

Although in the illustrated embodiment the conductive traces 56 are etched on to a semiconductor die together with other front end module or amplifier active circuitry, it is possible to implement the same with bond wires. However, there are various performance degradations associated therewith, including increased insertion loss and lower rejection.

At the terminal of the conductive traces 56, there is another separate conductive trace 58 that connects to a conductive pad 60 on a printed circuit board. There may be an additional conductive pad 62 with a through-hole via 64 to an RF ground plane. Furthermore, the conductive pad 60 and the conductive pad 62 on the printed circuit board may be bridged with yet another conductive trace 66. The conductive pad 60 may additionally include a solder ball 61 or a copper pillar as utilized in flip-chip structures. The totality of the conductive trace 58, the conductive pads 60, 62, and the via 64 may correspond to the fifth inductor L5.

Figure 31:
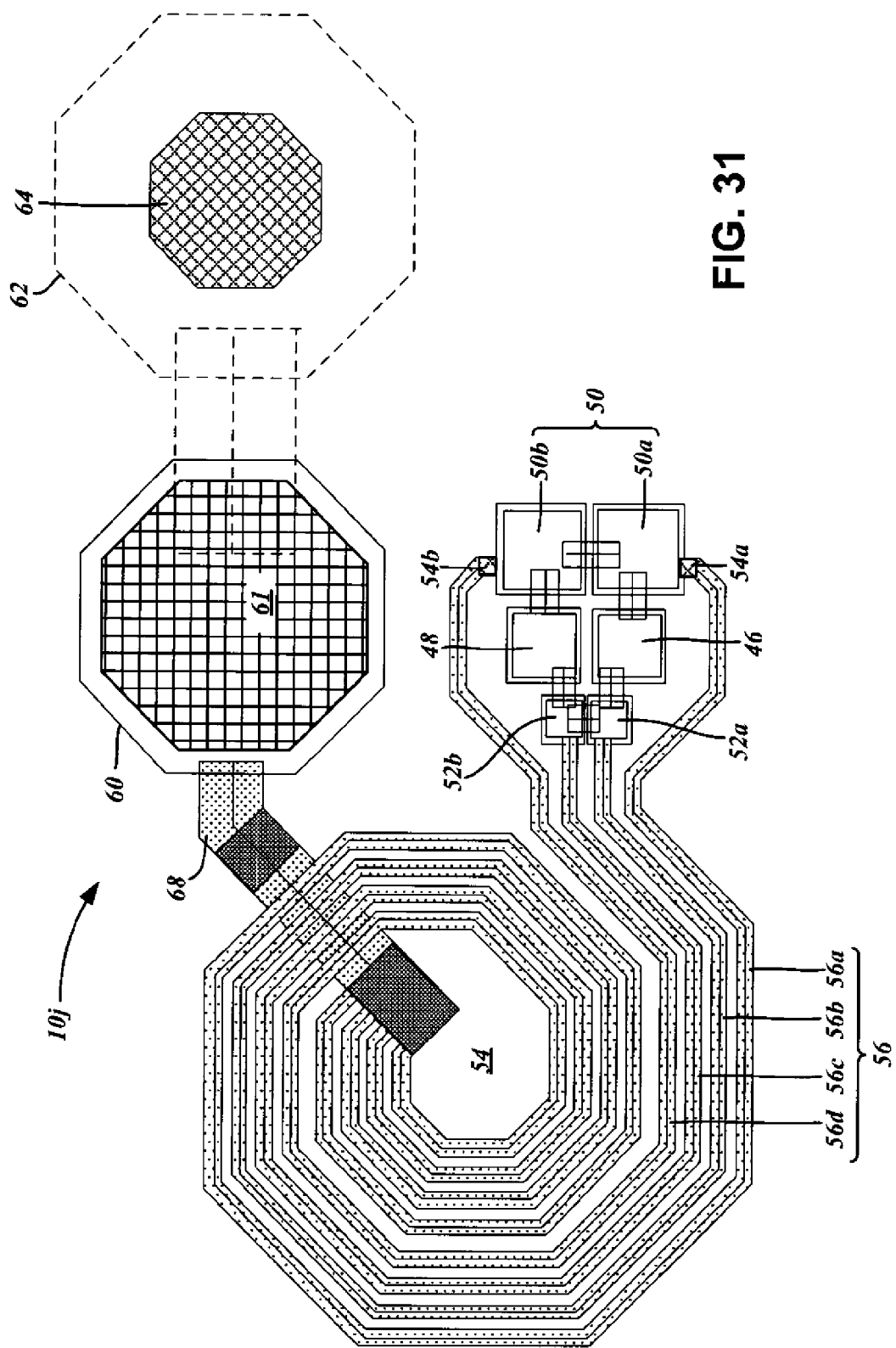
FIG. 31 is a plan view of a variation of the physical layout implementation of the coupled resonator filter with multi-turn inductor coils.

Another implementation is shown in FIG. 31, in which the conductive traces 56 have multiple turns in the central region 54. Because of the termination point inside such central region, the interconnection to the conductive pad 60 is an under-path trace 68.

Figure 32:
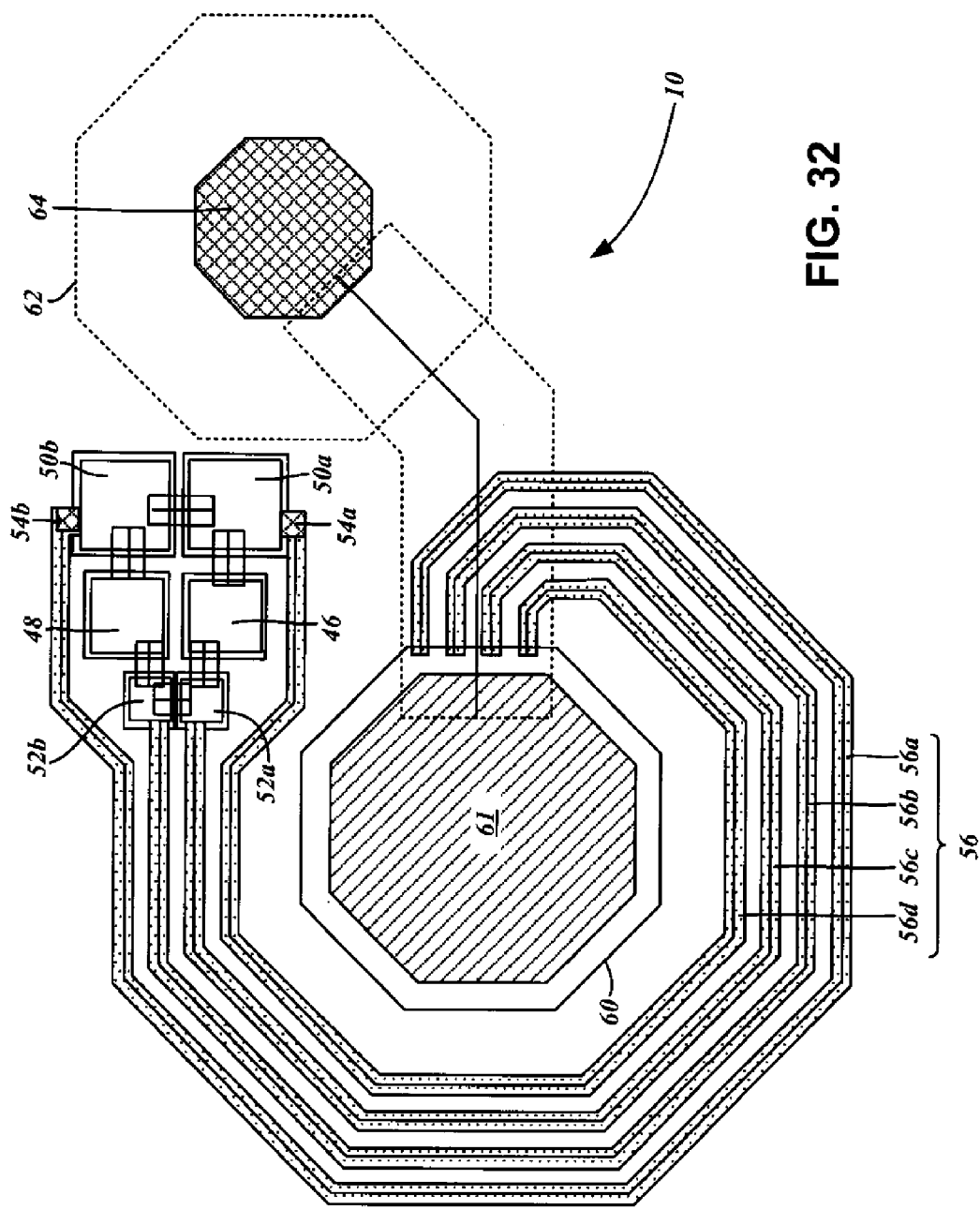
FIG. 32 is a plan view of another variation of the physical layout of the coupled resonator filter with an exposed conductive pad to ground and an external conductive structure disposed within the center of the inductor coils.

The implementation shown in FIG. 32 shifts the position of the conductive pad 60, as well as any solder ball 61 of copper pillar affixed thereto, to the central region 54 within the spiral of the conductive traces 56. This reduces the value of the fifth inductor L5, though the overall size of the coupled resonator filter 10 is concomitantly reduced.

Figure 33:
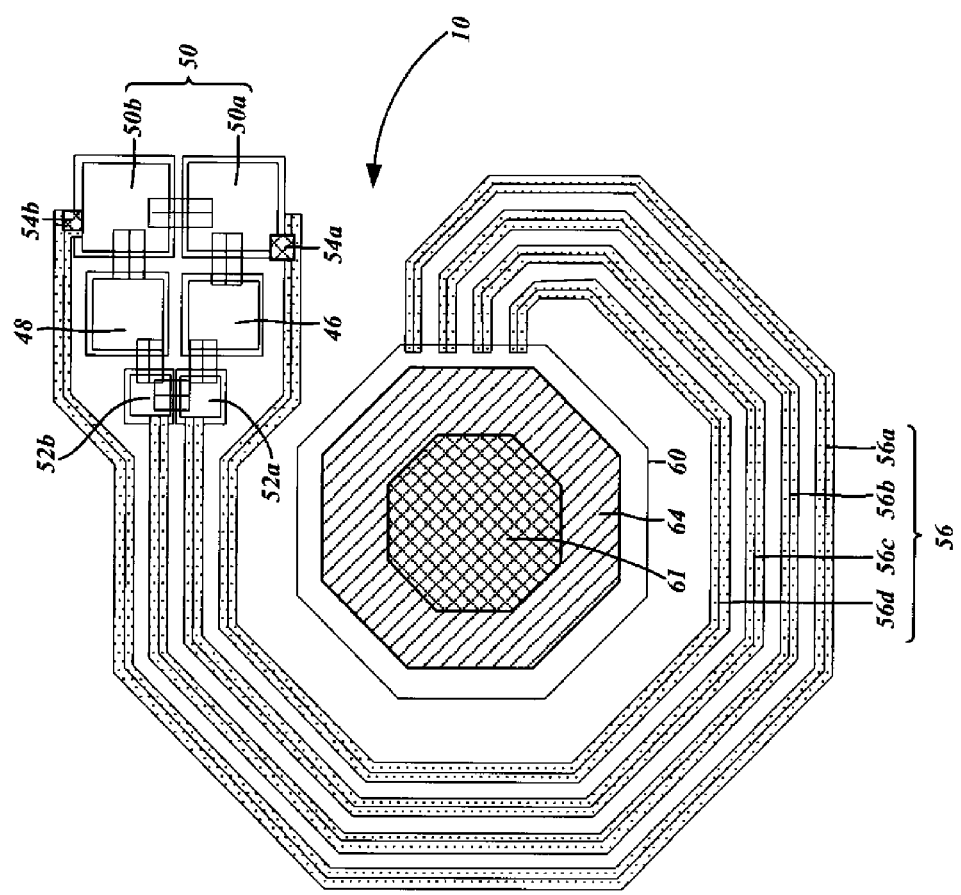
FIG. 33 is a plan view of yet another variation of the physical layout implementation of the coupled resonator filter with the external conductive structure and the exposed conductive pad being disposed within the center of the inductor coils.

Finally, the implementation shown in FIG. 33 additionally shifts the through-hole via 64, in addition to the conductive pad 60, and any solder ball 61 or copper pillar affixed thereto, to the central region 54, around which the conductive traces 56 spiral. This results in the smallest size on the semiconductor die, though resulting in the lowest value of the inductor L5.

The particulars shown herein are by way of example and for purposes of illustrative discussion of the embodiments of the coupled resonator filter only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency filter circuit for rejecting one or more spurious components of an input signal, the filter circuit comprising:
   a first resonator circuit including a first capacitor and a first coupled inductor pair of a first inductor and a second inductor, the first and second inductors being magnetically coupled and indirectly electrically connected;
   a second resonator circuit including a second capacitor and a second coupled inductor pair of a third inductor and a fourth inductor, the third and fourth inductors being magnetically coupled and indirectly electrically connected, an inductive coupling between the first coupled inductor pair and the second coupled inductor pair being near zero;
   first and second resonator coupling capacitors each connected to the first resonator circuit and the second resonator circuit;
   a first port connected to at least one of the first resonator circuit or the second resonator circuit; and
   a second port connected to at least one of the first resonator circuit or the second resonator circuit, the input signal being transmitted to one of the first port and the second port, and a filtered signal of the input signal passed through both the first resonator circuit and the second resonator circuit and outputted from the other one of the first port and the second port.

2. The radio frequency filter circuit of claim 1 wherein the first port is connected to the first resonator circuit and the second port is connected to the second resonator circuit.

3. The radio frequency filter circuit of claim 2 wherein the first port is connected to the first inductor, the first capacitor, and the first resonator coupling capacitor, and the second port is connected to the second resonator coupling capacitor, the third inductor, and the second capacitor.

4. The radio frequency filter circuit of claim 1 wherein the first port is connected to the second resonator circuit and the second port is connected to the first resonator circuit.

5. The radio frequency filter circuit of claim 4 wherein the first port is connected to the first capacitor, the second inductor, and the first resonator coupling capacitor, and the second port is connected to the first inductor, the second resonator coupling capacitor, and the first capacitor.

6. The filter circuit of claim 1 wherein the first and second inductors are magnetically coupled with a coupling coefficient of around 0.1 and the third and fourth inductors are magnetically coupled with a coupling coefficient of around 0.1.

7. The radio frequency filter circuit of claim 1 wherein an impedance of the second port is 50 Ohms.

8. The radio frequency filter circuit of claim 1 wherein the first resonator circuit, the second resonator circuit, and the first and second resonant coupling capacitors are integrally fabricated on a semiconductor die.

9. The radio frequency filter circuit of claim 8 wherein the first inductor, the second inductor, the third inductor, and the fourth inductor are fabricated as conductive traces etched on to the semiconductor die.

10. The radio frequency filter circuit of claim 1 wherein the first inductor, the second inductor, the third inductor, and the fourth inductor are fabricated with bond wire.

11. The radio frequency filter circuit of claim 1 wherein the first capacitor, the second capacitor, the first resonator coupling capacitor and the second resonator coupling capacitor are metal-insulator-metal (MIM) capacitors.

12. The radio frequency filter circuit of claim 1 wherein the radio frequency circuit is connectable to an input of a radio frequency front end module having an operating mode in a primary operating frequency range for coexistence with transceivers concurrently operating in a first operating frequency range and a second operating frequency range, the first resonator circuit and the second resonator circuit in combination being configured to have a first rejection level for a signal frequency component in the first operating frequency range, a second rejection level for a different signal frequency component in the second operating frequency range, and a predefined insertion loss at the primary operating frequency range.

13. The filter circuit of claim 12 wherein the first resonator circuit and the second resonator circuit are further configured to have a third rejection level for a second harmonic frequency component of the signal frequency component in either one of the first operating frequency range and the second operating frequency range.

14. The filter circuit of claim 12 wherein the first operating frequency range corresponds to a frequency band assigned to cellular communications operations.

15. The filter circuit of claim 14 wherein the second operating frequency range corresponds to a frequency band assigned to a different segment of cellular communications operations.

16. The filter circuit of claim 12 wherein the first operating frequency range corresponds to a frequency band assigned to global positioning system (GPS) operations.

17. The filter circuit of claim 12 wherein the predefined insertion loss is less than 2.5 dB.

18. A radio frequency filter circuit for rejecting one or more spurious components of an input signal, the filter circuit comprising:
 a first resonator circuit including a first capacitor and a first coupled inductor pair of a first inductor and a second inductor, the first and second inductors being magnetically coupled with a coupling coefficient of around 0.35 and indirectly electrically connected;
 a second resonator circuit including a second capacitor and a second coupled inductor pair of a third inductor and a fourth inductor, the third and fourth inductors being magnetically coupled with a coupling coefficient of around 0.35 and indirectly electrically connected;
 first and second resonator coupling capacitors each connected to the first resonator circuit and the second resonator circuit;
 a first port connected to at least one of the first resonator circuit and or the second resonator circuit; and
 a second port connected to at least one of the first resonator circuit or the second resonator circuit, the input signal being transmitted to one of the first port and the second port, and a filtered signal of the input signal passed through both the first resonator circuit and the second resonator circuit and outputted from the other one of the first port and the second port.

19. A radio frequency filter circuit for rejecting one or more spurious components of an input signal, the filter circuit comprising:
 a first resonator circuit including a first capacitor and a first coupled inductor pair of a first inductor and a second inductor, the first and second inductors being magnetically coupled and indirectly electrically connected;
 a second resonator circuit including a second capacitor and a second coupled inductor pair of a third inductor and a fourth inductor, the third and fourth inductors being magnetically coupled and indirectly electrically connected, an inductive coupling between the first coupled inductor pair and the second coupled inductor pair being near zero;
 a resonator coupling capacitor connected to the first resonator circuit and the second resonator circuit;
 a first port connected to at least one of the first resonator circuit or the second resonator circuit; and
 a second port connected to at least one of the first resonator circuit or the second resonator circuit, the input signal being transmitted to one of the first port and the second port, and a filtered signal of the input signal passed through both the first resonator circuit and the second resonator circuit and outputted from the other one of the first port and the second port.

20. The radio frequency filter circuit of claim 19 wherein the first port is connected to the first resonator circuit and the second port is connected to the second resonator circuit.

21. The radio frequency filter circuit of claim 20 wherein the first port is connected to the first inductor, the first capacitor, and the resonator coupling capacitor, and the second port is connected to the fourth inductor, the second capacitor, and the resonator coupling capacitor.

22. The radio frequency filter circuit of claim 19 further comprising a common inductor connected to the first inductor and the second inductor of the first coupled inductor pair, and to the third inductor and the fourth inductor of the second coupled inductor pair.

23. The radio frequency filter circuit of claim 22 wherein an impedance of the second port is 30 Ohms.

24. The radio frequency filter circuit of claim 22 wherein an impedance of the second port is 50 Ohms.

25. The radio frequency filter circuit of claim 19 further comprising a second resonator coupling capacitor connected to the first resonator circuit and the second resonator circuit.

26. The radio frequency filter circuit of claim 25 wherein the second resonator coupling capacitor is connected to the first capacitor and the second inductor, and to the second capacitor and the third inductor.

27. The radio frequency filter circuit of claim 25 wherein the third inductor, the second capacitor, and the first resonator coupling capacitor are connected to the second port, and the second resonator coupling capacitor and the second capacitor are connected to the fourth inductor.

28. The radio frequency filter circuit of claim 27 further comprising a common inductor connected to the first inductor and the second inductor of the first coupled inductor pair, and to the third inductor and the fourth inductor of the second coupled inductor pair.

29. The radio frequency filter circuit of claim 28 wherein an impedance of the second port is 50 Ohms.

30. The radio frequency filter circuit of claim 28 wherein an impedance of the second port is 30 Ohms.

31. The radio frequency filter circuit of claim 25 wherein the first inductor, the second inductor, the third inductor, and the fourth inductor are fabricated as a series of adjacently positioned conductive traces etched on to a semiconductor die as one or more coils, a predefined length of the conductive trace of any one of the first to fourth inductors corresponding to an inductance thereof, and a predefined distance from any one of the conductive traces to another one of the conductive traces corresponding to a coupling thereto.

32. The radio frequency filter circuit of claim 31 wherein the first capacitor, the second capacitor, and the resonator coupling capacitor are metal-insulator-metal (MIM) capacitors.

33. The radio frequency filter circuit of claim 31 further comprising an exposed conductive pad connectible to ground, the conductive traces of the first inductor, the second inductor, the third inductor, and the fourth inductor being connected to the exposed conductive pad.

34. The radio frequency filter circuit of claim 33 wherein the exposed conductive pad is spaced from the one or more coils of the conductive traces, an under-path conductive trace connecting the exposed conductive pad to the conductive traces.

35. The radio frequency filter circuit of claim 34 further comprising a solder ball attached to a substrate and electrically connected to one or more of the conductive traces.

36. The radio frequency filter circuit of claim 34 further comprising a copper pillar attached to a substrate and electrically connected to one or more of the conductive traces.

37. The radio frequency filter circuit of claim 33 wherein the exposed conductive pad is positioned within a center region of the one or more coils of the conductive traces.

38. The radio frequency filter circuit of claim 37 further comprising a solder ball attached to the exposed conductive pad and electrically connected to one or more of the conductive traces.

39. The radio frequency filter circuit of claim 37 further comprising a copper pillar attached to the exposed conductive pad and electrically connected to one or more of the conductive traces.

40. The radio frequency filter circuit of claim 37 wherein the exposed conductive pad is connected to a ground plane with a via.

41. The filter circuit of claim 19 wherein the first and second inductors are magnetically coupled with a coupling coefficient of around 0.35 and the third and fourth inductors are magnetically coupled with a coupling coefficient of around 0.35.

42. The filter circuit of claim 41 wherein there is a substantially zero coupling coefficient between the first and third inductors, between the first and fourth inductors, between the second and third inductors, and between the second and fourth inductors.

43. The radio frequency filter circuit of claim 19 wherein the first inductor, the second inductor, the third inductor, and the fourth inductor are fabricated as a series of adjacently positioned conductive traces etched on to a semiconductor die as one or more coils, a predefined length of the conductive trace of any one of the first to fourth inductors corresponding to an inductance thereof, and a predefined distance from any one of the conductive traces to another one of the conductive traces corresponding to a coupling thereto.

44. The radio frequency filter circuit of claim 43 further comprising an exposed conductive pad connectible to ground, the conductive traces of the first inductor, the second inductor, the third inductor, and the fourth inductor being connected to the exposed conductive pad.

45. The radio frequency filter circuit of claim 44 wherein the exposed conductive pad is spaced from the one or more coils of the conductive traces, an under-path conductive trace connecting the exposed conductive pad to the conductive traces.

46. The radio frequency filter circuit of claim 45 further comprising a solder ball attached to a substrate and electrically connected to one or more of the conductive traces.

47. The radio frequency filter circuit of claim 45 further comprising a copper pillar attached to a substrate and electrically connected to one or more of the conductive traces.

48. The radio frequency filter circuit of claim 44 wherein the exposed conductive pad is positioned within a center region of the one or more coils of the conductive traces.

49. The radio frequency filter circuit of claim 48 further comprising a solder ball attached to the exposed conductive pad and electrically connected to one or more of the conductive traces.

50. The radio frequency filter circuit of claim 48 further comprising a copper pillar attached to the exposed conductive pad and electrically connected to one or more of the conductive traces.

51. The radio frequency filter circuit of claim 48 wherein the exposed conductive pad is connected to a ground plane with a via.

52. The radio frequency filter circuit of claim 43 wherein the first capacitor, the second capacitor, and the resonator coupling capacitor are metal-insulator-metal (MIM) capacitors.

* * * * *